US009839163B2

(12) United States Patent
Keisling et al.

(10) Patent No.: US 9,839,163 B2
(45) Date of Patent: Dec. 5, 2017

(54) MODULAR IT RACK COOLING ASSEMBLIES AND METHODS FOR ASSEMBLING SAME

(71) Applicant: Inertech IP LLC, Danbury, CT (US)

(72) Inventors: Earl Keisling, Ridgefield, CT (US); John Costakis, Hyde Park, NY (US); Gerald McDonnell, Poughquag, NY (US)

(73) Assignee: Inertech IP LLC, Danbury, CT (US)

( * ) Notice: Subject to any disclaimer, the term of this patent is extended or adjusted under 35 U.S.C. 154(b) by 0 days.

(21) Appl. No.: 15/362,487

(22) Filed: Nov. 28, 2016

(65) Prior Publication Data

US 2017/0079165 A1 Mar. 16, 2017

Related U.S. Application Data

(63) Continuation of application No. 14/665,866, filed on Mar. 23, 2015, now abandoned, which is a
(Continued)

(51) Int. Cl.
*G06F 1/20* (2006.01)
*H05K 7/20* (2006.01)
*H05K 7/18* (2006.01)

(52) U.S. Cl.
CPC ...... *H05K 7/20745* (2013.01); *H05K 7/20736* (2013.01); *H05K 7/20781* (2013.01); *H05K 7/20827* (2013.01); *Y10T 29/49826* (2015.01)

(58) Field of Classification Search
CPC ........... H05K 7/20745; H05K 7/20781; H05K 7/2079; H05K 7/20772; H05K 7/20827;
(Continued)

(56) References Cited

U.S. PATENT DOCUMENTS 4,535,386 A   8/1985  Frey, Jr. et al.
5,467,250 A   11/1995 Howard et al.
(Continued)

FOREIGN PATENT DOCUMENTS

DE   20 2004 003 309 U1   8/2004
DE   20 2004 003 310 U1   8/2004
(Continued)

OTHER PUBLICATIONS

International Search Report issued in corresponding application No. PCT/US2011/067685 dated Jun. 18, 2012.
(Continued)

*Primary Examiner* — James Wu
*Assistant Examiner* — Michael Matey
(74) *Attorney, Agent, or Firm* — Carter, DeLuca, Farrell & Schmidt, LLC

(57) ABSTRACT

A modular server rack cooling structure for cooling at least one server in at least one server rack of a data center assembly includes at least a first supporting member and at least a first heat exchanger. The first heat exchanger is coupled to the first supporting member, which is configured to position the first heat exchanger in heat transfer relationship with the at least one server. The first heat exchanger is not attached to the at least one server rack. The modular server rack cooling structure is also applied to a system that includes at least a first rack and at least a second rack disposed opposite from one another to form a hot aisle or a cold aisle. A method is disclosed for installing additional heat exchangers on the support structure of a modular server rack cooling structure to meet increased cooling capacity requirements without requiring additional space.

18 Claims, 19 Drawing Sheets

Related U.S. Application Data continuation of application No. 13/517,092, filed as application No. PCT/US2011/067685 on Dec. 28, 2011, now abandoned.

(60) Provisional application No. 61/482,070, filed on May 3, 2011, provisional application No. 61/448,631, filed on Mar. 2, 2011.

(58) Field of Classification Search
CPC .......... H05K 7/20836; H05K 7/20809; H05K 7/20318; H05K 7/20736; H05K 7/1497; H05K 7/20; H05K 7/20254; H05K 7/20272

See application file for complete search history.

(56) References Cited

U.S. PATENT DOCUMENTS

| | | | |
|---|---|---|---|
| 5,797,275 A | 8/1998 | Forsman | |
| 6,023,935 A | 2/2000 | Okazaki et al. | |
| 6,034,873 A | 3/2000 | Ståhl et al. | |
| 6,164,369 A | 12/2000 | Stoller | |
| 6,640,561 B2 | 11/2003 | Roberto | |
| 6,714,412 B1 | 3/2004 | Chu et al. | |
| 6,819,563 B1 | 11/2004 | Chu et al. | |
| 6,924,981 B2 | 8/2005 | Chu et al. | |
| 6,927,980 B2 | 8/2005 | Fukuda et al. | |
| 7,036,330 B2 | 5/2006 | Grabon et al. | |
| 7,106,590 B2 | 9/2006 | Chu et al. | |
| 7,159,518 B2 | 1/2007 | Haas et al. | |
| 7,184,267 B2 | 2/2007 | Patel | |
| 7,255,640 B2 | 8/2007 | Aldag et al. | |
| 7,278,273 B1 | 10/2007 | Whitted et al. | |
| 7,312,993 B2 | 12/2007 | Bundza et al. | |
| 7,397,661 B2 | 7/2008 | Campbell et al. | |
| 7,430,118 B1 | 9/2008 | Noteboom et al. | |
| 7,511,959 B2 | 3/2009 | Belady et al. | |
| 7,660,116 B2 | 2/2010 | Claassen et al. | |
| 7,679,909 B2 | 3/2010 | Spearing et al. | |
| 7,724,516 B2 | 5/2010 | Harder et al. | |
| 7,724,518 B1 | 5/2010 | Carlson et al. | |
| 7,746,634 B2 | 6/2010 | Hom et al. | |
| 7,746,637 B2 | 6/2010 | Donowho et al. | |
| 7,836,597 B2 | 11/2010 | Datta et al. | |
| 7,856,838 B2 | 12/2010 | Hillis et al. | |
| 7,864,527 B1 | 1/2011 | Whitted | |
| 7,872,865 B2 | 1/2011 | Matsushima et al. | |
| 7,957,142 B2 | 6/2011 | Noteboom et al. | |
| 7,961,463 B2 | 6/2011 | Belady et al. | |
| 8,004,839 B2 | 8/2011 | Sato et al. | |
| 8,006,496 B2 | 8/2011 | Carter | |
| 8,031,468 B2* | 10/2011 | Bean, Jr. | H05K 7/20745 165/104.33 |
| 8,077,457 B2 | 12/2011 | Gauthier et al. | |
| 8,113,010 B2 | 2/2012 | Carlson | |
| 8,120,916 B2 | 2/2012 | Schmidt et al. | |
| 8,261,561 B2 | 9/2012 | Rigal et al. | |
| 8,320,125 B1* | 11/2012 | Hamburgen | H05K 7/2079 165/104.33 |
| 2004/0100770 A1 | 5/2004 | Chu et al. | |
| 2004/0118136 A1 | 6/2004 | Patel et al. | |
| 2004/0190270 A1 | 9/2004 | Aldag et al. | |
| 2004/0221604 A1 | 11/2004 | Ota et al. | |
| 2004/0226686 A1 | 11/2004 | Maeda | |
| 2005/0235671 A1 | 10/2005 | Belady et al. | |
| 2006/0000596 A1 | 1/2006 | Kranz et al. | |
| 2006/0065000 A1 | 3/2006 | Belady | |
| 2006/0232945 A1 | 10/2006 | Chu et al. | |
| 2007/0019391 A1 | 1/2007 | Xu et al. | |
| 2007/0167125 A1 | 7/2007 | Rasmussen et al. | |
| 2007/0227710 A1 | 10/2007 | Belady et al. | |
| 2007/0283710 A1 | 12/2007 | Gilbert et al. | |
| 2008/0018212 A1 | 1/2008 | Spearing et al. | |
| 2008/0024997 A1 | 1/2008 | Ghantiwala | |
| 2008/0055846 A1 | 3/2008 | Clidaras et al. | |
| 2008/0055848 A1 | 3/2008 | Hamburgen et al. | |
| 2008/0094797 A1 | 4/2008 | Coglitore et al. | |
| 2008/0123288 A1 | 5/2008 | Hillis | |
| 2008/0158815 A1 | 7/2008 | Campbell et al. | |
| 2008/0174961 A1 | 7/2008 | Campbell et al. | |
| 2008/0233069 A1 | 9/2008 | Tamareselvy et al. | |
| 2008/0273306 A1* | 11/2008 | Campbell | H05K 7/20745 361/698 |
| 2008/0285228 A1 | 11/2008 | Koch et al. | |
| 2008/0291626 A1* | 11/2008 | Nelson | F24F 1/0059 361/696 |
| 2009/0122487 A1* | 5/2009 | Campbell | H05K 7/20745 361/698 |
| 2009/0133866 A1 | 5/2009 | Campbell et al. | |
| 2009/0207880 A1 | 8/2009 | Ahladas et al. | |
| 2009/0216910 A1 | 8/2009 | Duchesneau | |
| 2009/0241578 A1 | 10/2009 | Carlson et al. | |
| 2010/0077788 A1 | 4/2010 | Lewis | |
| 2010/0091448 A1 | 4/2010 | Noteboom et al. | |
| 2010/0136895 A1 | 6/2010 | Sgro | |
| 2010/0144265 A1 | 6/2010 | Bednarcik et al. | |
| 2010/0188816 A1* | 7/2010 | Bean, Jr. | H05K 7/20745 361/696 |
| 2010/0263830 A1* | 10/2010 | Noteboom | H05K 7/2079 165/80.2 |
| 2011/0100045 A1 | 5/2011 | Carlson | |
| 2011/0154842 A1 | 6/2011 | Heydari et al. | |
| 2011/0271695 A1 | 11/2011 | Kashirajima et al. | |
| 2011/0299242 A1* | 12/2011 | Grantham | H05K 7/20745 361/688 |
| 2012/0010754 A1 | 1/2012 | Matteson | |
| 2012/0012283 A1* | 1/2012 | Bean, Jr. | H05K 7/20745 165/104.33 |
| 2012/0125023 A1 | 5/2012 | Kopko et al. | |
| 2012/0134108 A1* | 5/2012 | Brouillard | H05K 7/20745 361/679.49 |
| 2012/0167670 A1 | 7/2012 | Bean, Jr. et al. | |
| 2013/0077238 A1* | 3/2013 | Babish | H01L 23/473 361/689 |

FOREIGN PATENT DOCUMENTS

| | | |
|---|---|---|
| GB | 2 444 981 | 6/2008 |
| WO | 99/63797 A1 | 12/1999 |
| WO | 2009/114103 A1 | 9/2009 |
| WO | 2009/156647 A1 | 12/2009 |
| WO | 2010/087915 A1 | 8/2010 |
| WO | 2010/141205 A1 | 12/2010 |

OTHER PUBLICATIONS

PCT International Search Report for International Application No. PCT/US/2011/043893 dated Feb. 17, 2012.

PCT International Search Report for International Application No. PCT/US/2011/041710 dated Feb. 24, 2012.

Sylvain Quoilin and Vincent Lemort, "Technological and Economical Survey of Organic Rankine Cycle Systems", symposium paper, Thermodynamics Laboratory, University of Liege—5th European Conference Economics and Management of Energy in Industry—Algarve, Portugal Centro de Energia e Tecnologia; Apr. 14-17, 2009, pp. 1-12.

Coolcentric "Products—Coolcentric Coolant Distribution Units", pp. 1-2, website, http://www.coolcentric.com/products/coolant-distribution_units.php, Feb. 22, 2012.

Coolcentric "Products—Technology Overview", pp. 1-2, website, http://www.coolcentric.com/products/technology.php, Feb. 22, 2012.

Canadian Office Action dated Oct. 13, 2017 issued in corresponding Canadian Application No. 2,827,960.

* cited by examiner

MODULAR IT RACK COOLING ASSEMBLIES AND METHODS FOR ASSEMBLING SAME

BACKGROUND

1. Technical Field

The present disclosure generally relates to computing or information technology (IT) data centers. More particularly, the present disclosure relates to structures, systems and methods for installing heat exchangers in IT data centers.

2. Background of Related Art

Over the past several years, computer equipment manufacturers have expanded the data collection and storage capabilities of their servers. The expansion of server capabilities has led to an increase in total power consumption and total heat output per server and per server rack assembly in data centers. It has also led to an increase in power and temperature control requirements for computer data collection and storage. As a result, the data collection and storage industry has sought and is seeking new, innovative equipment, systems, and design strategies to handle the tremendous and continued growth in capacity of computer data collection and storage.

Cooling systems for computer server racks have been struggling to keep pace with the ability to cool ever increasing computer server heat loads in data centers. The increase of computer server heat loads (measured in kilowatts (kW)) has required that more space be allotted for the cooling infrastructure within the data rooms or that the cooling systems are concentrated at the heat source, i.e., the computer server racks. Recently, cooling systems have been designed to concentrate the cooling at the computer server racks. These cooling systems include rear-door heat exchangers and rack-top coolers.

Certain cooling system designs have incorporated de-ionized water while others use R-134a (i.e., 1,1,1,2-Tetrafluoroethane) refrigerant in a mostly liquid state. The latest designs are limited in their ability to be scaled to cooling requirements of increasingly high density data centers. The output capacity of rear-door exchangers is limited to the physical size of the computer rack exterior perimeter and the amount of fluid (measured in gallons per minute (gpm)) that can be applied to a rear-door exchanger without excessive pressure drops. The rear-door exchangers can produce up to approximately 12-16 kW of concentrated cooling to computer server racks. The overhead rack coolers can produce up to 20 kW of cooling output using R-134a refrigerant liquid. This is based on a cooling system design that does not change the state of the refrigerant. Therefore, the total capacity is limited to the physical size of the coils as well as the size of the enclosure for the computer server racks. This equates to approximately 41,000 to approximately 55,000 BTUs per hour (about 12 KW to about 16.1 KW) of total heat rejection capabilities per rack assembly.

Some computer servers can now produce outputs in excess of 35 kW similar to the IBM Blue Jean Server. The rear-door heat exchangers and other similar cooling products on the market cannot handle the cooling requirements of these high-density computer servers.

Many existing data centers have been constructed with in-row rack cooling systems and integral hot and cold aisle containment. These data centers, however, waste a significant amount of space. Also, it is difficult to increase the cooling capacity of the in-row rack cooling systems when servers are added to the server racks or existing servers are replaced with servers requiring more cooling capacity. Furthermore, it is difficult for many existing data centers to upgrade their cooling systems to comply with future government regulations that require reductions in energy consumption. Thus, the data center industry has been seeking energy efficient modular cooling solutions for new and existing white space in data centers, as well as "just-in-time" and modular cooling expansion capabilities both at the server level as well as at the overall rack level.

SUMMARY

In one aspect, the present disclosure features a modular server rack cooling structure for cooling at least one server in at least one rack of a data center. The modular server rack cooling structure for cooling at least one server in at least one rack of a data center includes at least a first supporting member and at least a first heat exchanger that are coupled to each other. The first supporting member is configured to position the first heat exchanger in heat transfer relationship with the server, where the first heat exchanger is not attached to the rack.

In some embodiments, the first supporting member includes a beam member, the first heat exchanger has a dimension defining an edge of the first heat exchanger, and the edge of the first heat exchanger is rotatably coupled to the beam member. In some embodiment, the beam member is a horizontal beam member or a vertical beam member.

In some embodiment, the first supporting member includes at least a first, second, and third beam members. The first beam member is substantially orthogonally coupled to the second beam member and the third beam member is substantially orthogonally coupled to the second beam member to form a substantially U-shaped configuration. The first heat exchanger has a dimension defining an edge of the first heat exchanger and the edge of the first heat exchanger is rotatably coupled to the first beam member, second beam member, or third beam member.

In some embodiments, the dimension defining the edge of the first heat exchanger has a substantially longitudinal dimension defining a longitudinal edge of the first heat exchanger and the longitudinal edge of the first heat exchanger is rotatably coupled to the first beam member or the third beam member.

In some embodiments, the second supporting member includes a beam member, the second heat exchanger has a dimension defining an edge of the second heat exchanger, and the edge of the second heat exchanger is rotatably coupled to the beam member of the second supporting member. In some embodiments, the second heat exchanger is disposed vertically, horizontally, or diagonally. In some embodiments, the second supporting member includes a beam member and the second heat exchanger is coupled to the beam member of the second supporting member.

In some embodiments, the data center further includes at least a second rack for supporting at least one server, where the first rack and the second rack are disposed opposite one another to form a hot aisle or a cold aisle between the first rack and the second rack. The modular server rack cooling structure may further include at least a second supporting member and at least a second heat exchanger coupled to each other. The second supporting member is configured to position the second heat exchanger in heat transfer relationship with the server of the second rack, where the second heat exchanger is not attached to the second rack. In some embodiments, the modular server rack cooling structure further includes at least one forced fluid-flow device configured and disposed with respect to the first heat exchanger to provide a flow of fluid between the server and the first heat exchanger.

In another aspect, the present disclosure features a modular data center system including at least a first rack and at least a second rack disposed opposite one another to form a hot aisle or a cold aisle between the first rack and the second rack, each of which supports at least one server. The modular data center system also includes a modular server rack cooling structure including at least a first supporting member and at least a first heat exchanger coupled to each other. The first supporting member is configured to position the first heat exchanger in heat transfer relationship with at least one server of first rack so that the first heat exchanger is not attached to the first rack. The modular data center system also includes at least a second supporting member and at least a second heat exchanger coupled to each other. The second supporting member is configured to position the second heat exchanger in heat transfer relationship with at least one server of the second rack so that the second heat exchanger is not attached to the second rack.

In some embodiments, the first supporting member includes a beam member, the first heat exchanger has a dimension defining an edge of the first heat exchanger, the edge of the first heat exchanger is rotatably coupled to the beam member of the first supporting member, the second supporting member includes a beam member, the second heat exchanger has a dimension defining an edge of the second heat exchanger, and the edge of the second heat exchanger is rotatably coupled to the beam member of the second supporting member.

In some embodiments, the modular data center system further includes at least one forced fluid-flow device configured to provide a flow of fluid between the servers and the heat exchangers. In some embodiments, the beam members are vertical beam members disposed adjacent to the first rack and the second rack.

In some embodiments, the modular data center system further includes at least a third supporting member and at least a third heat exchanger coupled to each other. The third supporting member is configured to position the third heat exchanger in heat transfer relationship with the server of the first rack or the server of the second rack.

In some embodiments, the third supporting member includes a beam member, and the third heat exchanger has a dimension defining an edge of the third heat exchanger, and the edge of the third heat exchanger is rotatably coupled to the beam member of the third supporting member. In some embodiments, the third supporting member includes a beam member and the third heat exchanger is coupled to the beam member of the third supporting member. In some embodiments, the second heat exchanger is disposed vertically, horizontally or diagonally.

In some embodiments, the modular data center system further includes at least one forced fluid-flow device configured to provide a flow of fluid between the servers and the heat exchangers, at least a fourth supporting member, and at least a fourth heat exchanger in which the third heat exchanger is coupled to the fourth supporting member and the fourth supporting member is configured to position the fourth heat exchanger adjacent to the forced fluid-flow device.

In yet another aspect, the present disclosure features a method of installing a modular server rack cooling structure for cooling at least a first server installed in at least a first rack and at least a second server installed in at least a second rack in which the first rack and the second rack are disposed opposite from each other to form at least a portion of a hot aisle or a cold aisle. The method includes positioning at least a portion of a modular support structure in the hot aisle or the cold aisle where the modular support structure including at least a first support member, a second support member, and a third support member. The method also includes coupling at least a first heat exchanger to the first supporting member so that the first heat exchanger is positioned adjacent to the first server of the first rack. The method also includes coupling at least a second heat exchanger to the second supporting member so that the second heat exchanger is positioned adjacent to the second server of the second rack and coupling at least a third heat exchanger to the third supporting member so that the third heat exchanger is positioned within the hot aisle or the cold aisle, where coupling the third heat exchanger to the third supporting member is performed after at least a third server is installed in the first rack or the second rack.

BRIEF DESCRIPTION OF THE DRAWINGS

Various embodiments of the present disclosure are described herein with reference to the drawings. The drawings are not necessarily to scale, emphasis instead being placed upon illustrating the principles of the present disclosure wherein.

DETAILED DESCRIPTION

Figure 1:
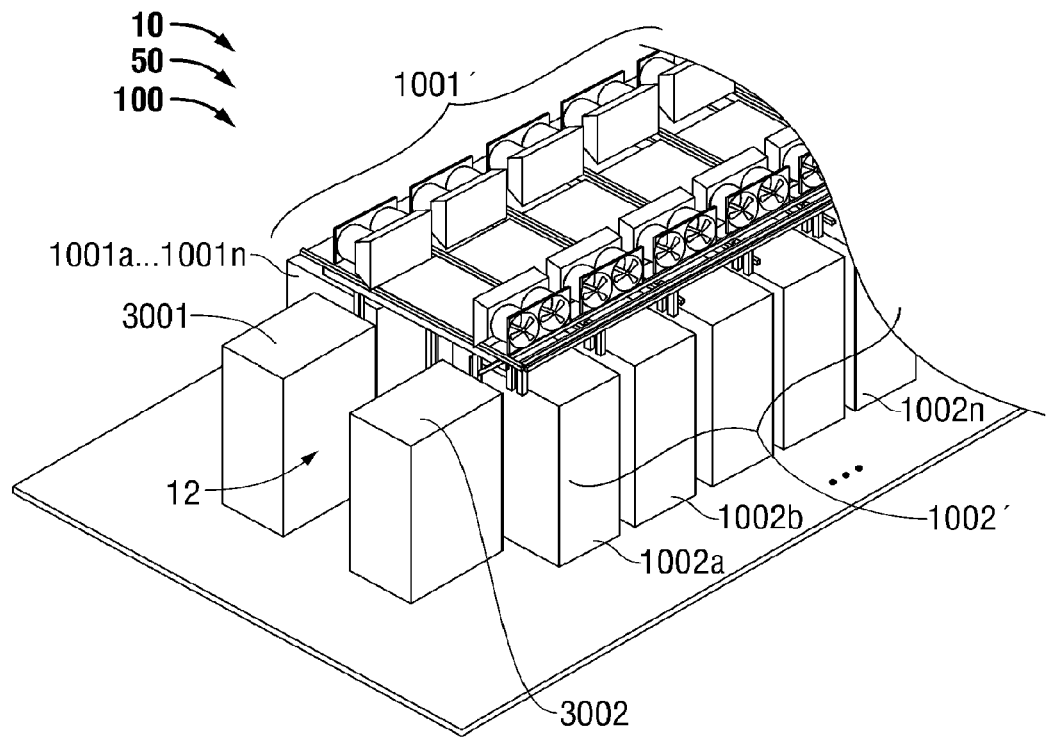
FIG. 1 is a perspective view of a data center assembly for information technology servers in a data center assembly that includes a plurality of modular support structures, each of which supports at least one heat exchanger according to embodiments of the present disclosure.

Embodiments of the presently disclosed heat exchanger support structures, heat exchanger support systems and installation methods will now be described in detail with reference to the drawings, in which like reference numerals designate identical or corresponding elements in each of the several views.

The presently disclosed heat exchanger support structures, heat exchanger support systems and installation method advance the state of the art of data center cooling by providing additional cooling capacity within the same floor space of an existing or planned data center, thus reducing the cooling capacity foot print of the data center and increasing the cooling capacity per unit area. The presently disclosed heat exchanger support structures, heat exchanger support systems and installation method can be retrofitted into existing data centers or planned as part of new installations.

FIG. 1 illustrates a modular unified racking system installation 100 for IT servers in a data center assembly 10 that includes a plurality of support structures of the modular server rack cooling structures, each of which supports at least one heat exchanger according to one embodiment of the present disclosure. More particularly, the data center assembly 10 includes a plurality of IT server racks $1001a, \ldots, 1001n$ positioned adjacent to one another to form a first row 1001' of IT server racks. A second row 1002' of adjacent IT server racks $1002a, \ldots, 1002n$ is formed opposite to the first row 1001' to form a hot aisle 12 between the first row 1001' and the second row 1002'.

Those skilled in the art will recognize that the first row 1001' of IT server racks and an adjacent wall (not shown) of a data center facility or an adjacent row of IT server racks define a first cold aisle. Similarly, the second row 1002' of IT server racks and an adjacent outer wall (not shown) of the data center assembly 10 or an adjacent row of IT server racks define a second cold aisle.

Those skilled in the art will recognize that, in some embodiments, the first row 1001' of IT server racks and the second row 1002' of IT server racks can form a cold aisle between the first row 1001' and the second row 1002'.

Figure 2:
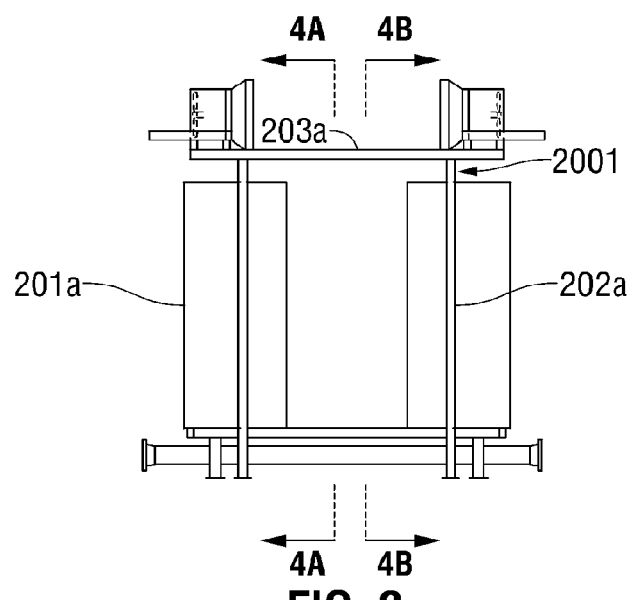
FIG. 2 is an elevation view of a modular support structure for supporting at least one heat exchanger in the data center assembly of FIG. 1 according to embodiments of the present disclosure.
Figure 3:
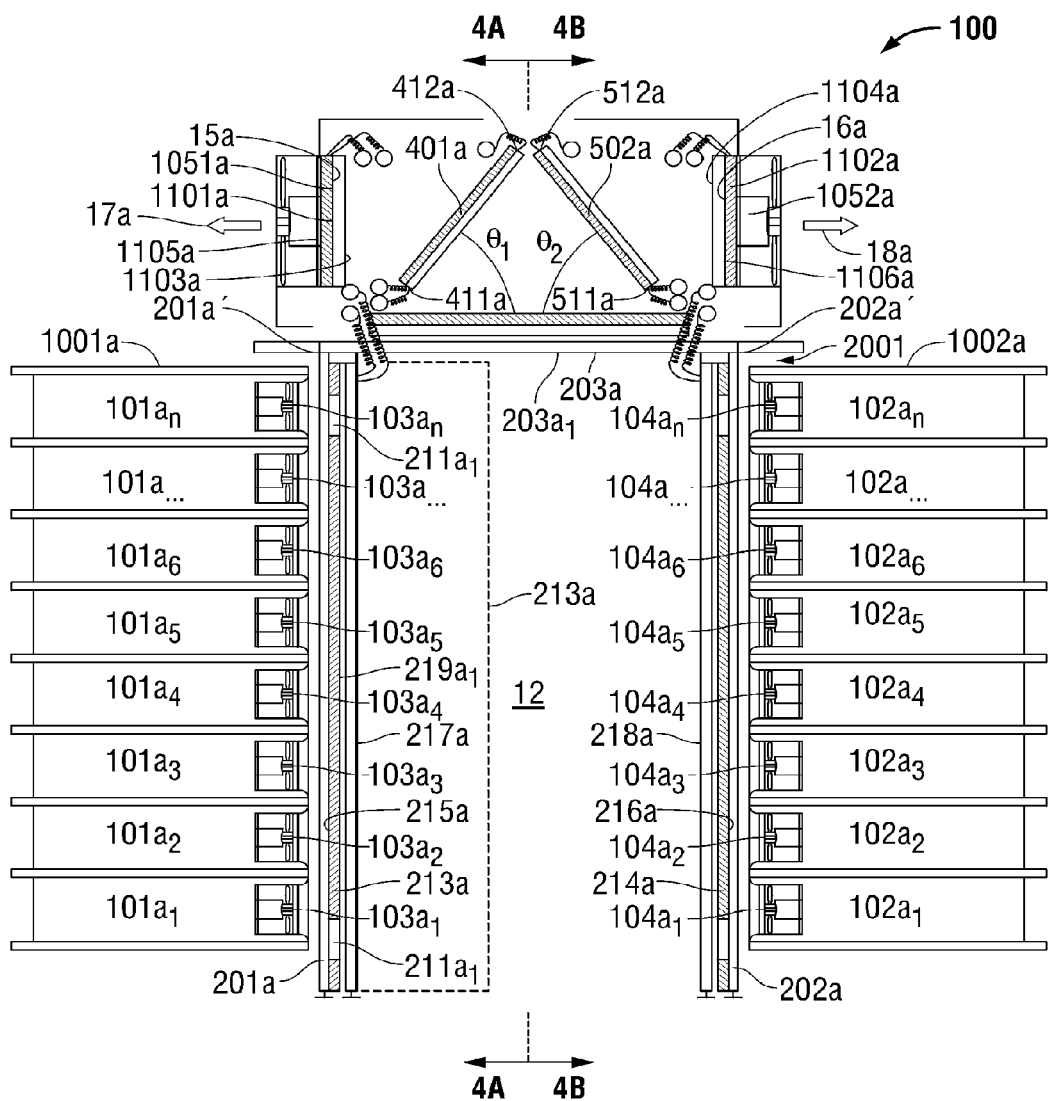
FIG. 3 is a detailed elevation view of the data center assembly of FIG. 2 showing the position of the heat exchangers with respect to the servers and server rack according to embodiments of the present disclosure.

Turning to FIG. 3 in conjunction with FIGS. 1 and 2, each server rack $1001a, \ldots, 1001n$ and $1002a, \ldots, 1002n$ includes a plurality of slots that are each configured to receive one server. As is known in the art, first server rack $1001a$ of first row 1001' has a plurality of IT servers $101a_1, \ldots, 101a_n$ in different slots of server rack $1001a$. Similarly, server rack $1002a$ of second row 1002' has a plurality of IT servers $102a_1, \ldots, 102a_n$ in different slots of server rack $1002a$. Each IT server $101a_1, \ldots, 101a_n$ has at least one heat transfer path $103a_1, \ldots, 103a_n$, respectively, which can include one or more exhaust fans and ports positioned at the rear end of each IT server $101a_1, \ldots, 101a_n$ as shown, or which can be upper, lower and/or side surfaces of each IT server $101a_1, \ldots, 101a_n$, or other heat transfer paths that are known in the art.

As used herein throughout the specification and figures, the letter "n" in the certain reference numerals represents a variable quantity. The use of the quantity "n" in the reference numerals, such as "$1001n$" or "$101a_n$," does not necessarily mean that the quantity "n" is always equal in each instance where the letter "n" is used. Those skilled in the art will recognize that the value of "n" may differ for practical applications of the embodiments of the present disclosure, and that "n" is applied to convey the description of multiple or "a plurality of" components or items.

As with IT servers $101a_1, \ldots, 101a_n$, each IT server $102a_1, \ldots, 102a_n$ has at least one heat transfer path $104a_1, \ldots, 104a_n$, respectively, which can include one or more exhaust fans and ports positioned at the rear end of each IT server $102a_1, \ldots, 102a_n$, as shown, or which can also be upper, lower and/or side surfaces of the IT servers $102a_1, \ldots, 102a_n$, or other heat transfer paths that are known in the art.

The modular server rack cooling structure 2001 includes at least a first supporting member 201a which is exemplarily illustrated as a vertically positioned beam positioned adjacent to the server rack $1001a$ at the rear end of the plurality of IT servers $101a_1, \ldots, 101a_n$, which as noted above, are disposed in different slots of the server rack $1001a$.

In one embodiment of the present disclosure, as shown in FIG. 3, the modular server rack cooling structure 2001 is configured and disposed to support at least one forced-flow cooling device $1051a$, e.g., a motorized fan, to provide forced-flow circulation from the hot aisle 12 directed toward the first cold aisle. The forced-flow cooling device $1051a$ is configured and disposed to define a region of separation between the hot aisle 12 and the first cold aisle. The first forced-flow cooling device $1051a$ includes a suction side $15a$ and a discharge side illustrated by the arrow $17a$, which indicates the direction of air flow. Since the first forced-flow cooling device 1051a is illustrated as being positioned vertically above the IT server rack 1001a, the region of separation is defined along the height of the first forced-flow cooling device 1051a above the IT server rack 1001a and therefore the region of separation occurs between the hot aisle 12 and the volume of space above the first row 1001' of IT server racks leading into the first cold aisle.

In one embodiment (not shown), the first forced-flow cooling device 1051a is positioned horizontally across the hot aisle 12 in proximity to the top of the IT server rack 1001a.

In some embodiments, the modular server rack cooling structure 2001 includes at least one heat exchanger. The first heat exchanger 1101a is configured and disposed with respect to the suction side 15a of the forced-flow cooling device 1051a to provide forced-flow cooling of the first heat exchanger 1101a.

In one embodiment, the first heat exchanger 1101a is a serpentine coil microchannel design having a thin rectangular configuration forming two large substantially flat sides such as a Model SX-2 Serpentine Coil heat exchanger manufactured by MBA Manufacturing and Supply Co. of Mundelein, Ill., USA or similar. The first heat exchanger 1101a has a first substantially flat side 1103a and a second substantially flat side 1105a. As illustrated in the exemplary embodiment of FIG. 3, the first heat exchanger 1101a is disposed in proximity to the suction side 15a of the first forced-flow cooling device 1051a. The first forced-flow cooling device 1051a is configured and disposed to maintain the region of separation between the hot aisle 12 and the first cold aisle 141 and to enable cooling of the hot air in the hot aisle 12 that emanates from the servers in the server racks and which flows across the serpentine coils of the first heat exchanger 1101a for cooling.

In one embodiment, the modular server rack cooling structure 2001 is also configured and disposed to support at least a second forced-flow cooling device 1052a, e.g., a motorized fan, to provide forced-flow circulation from the hot aisle 12 directed towards the second cold aisle 142. The second forced-flow cooling device 1052a is configured and disposed to define a region of separation between the hot aisle 12 and the second cold aisle 142 of the data center assembly 10. The second forced-flow cooling device 1052a includes a suction side 16a and a discharge side shown by the arrow 18a, which indicates the direction of air flow. As with the first forced-flow cooling device 1051a, since the second forced-flow cooling device 1052a is positioned vertically above the IT server rack 1002a, the region of separation between the hot aisle 12 and the second cold aisle 142 is defined along the height of the second forced-flow cooling device 1052a.

In one embodiment (not shown), the second forced-flow cooling device 1052a is positioned horizontally across the hot aisle 12 in proximity to the top of the IT server rack 1002a.

In some embodiments, the second heat exchanger 1102a is configured and disposed with respect to the suction side 16a of the forced-flow cooling device 1052a to provide forced-flow cooling of the second heat exchanger 1102a. In one embodiment, the second heat exchanger 1102a is again a serpentine coil microchannel design having a thin rectangular configuration forming two large substantially flat sides such as the Model SX-2 Serpentine Coil heat exchanger manufactured by MBA Manufacturing and Supply Co. of Mundelein, Ill., USA or similar, mentioned above. The second heat exchanger 1102a has a first substantially flat side 1104a and a second substantially flat side 1106a. As illustrated in the exemplary embodiment of FIG. 3, the second heat exchanger 1102a is disposed in proximity to the suction side 16a of the second forced-flow cooling device 1052a. The second forced-flow cooling device 1052a is configured and disposed to maintain the region of separation between the hot aisle 12 and the second cold aisle 142 and to enable cooling of the hot air in the hot aisle 12 that emanates from the IT servers in the server racks and which flows across the serpentine coils of the second heat exchanger 1102a for cooling.

Figure 4A:
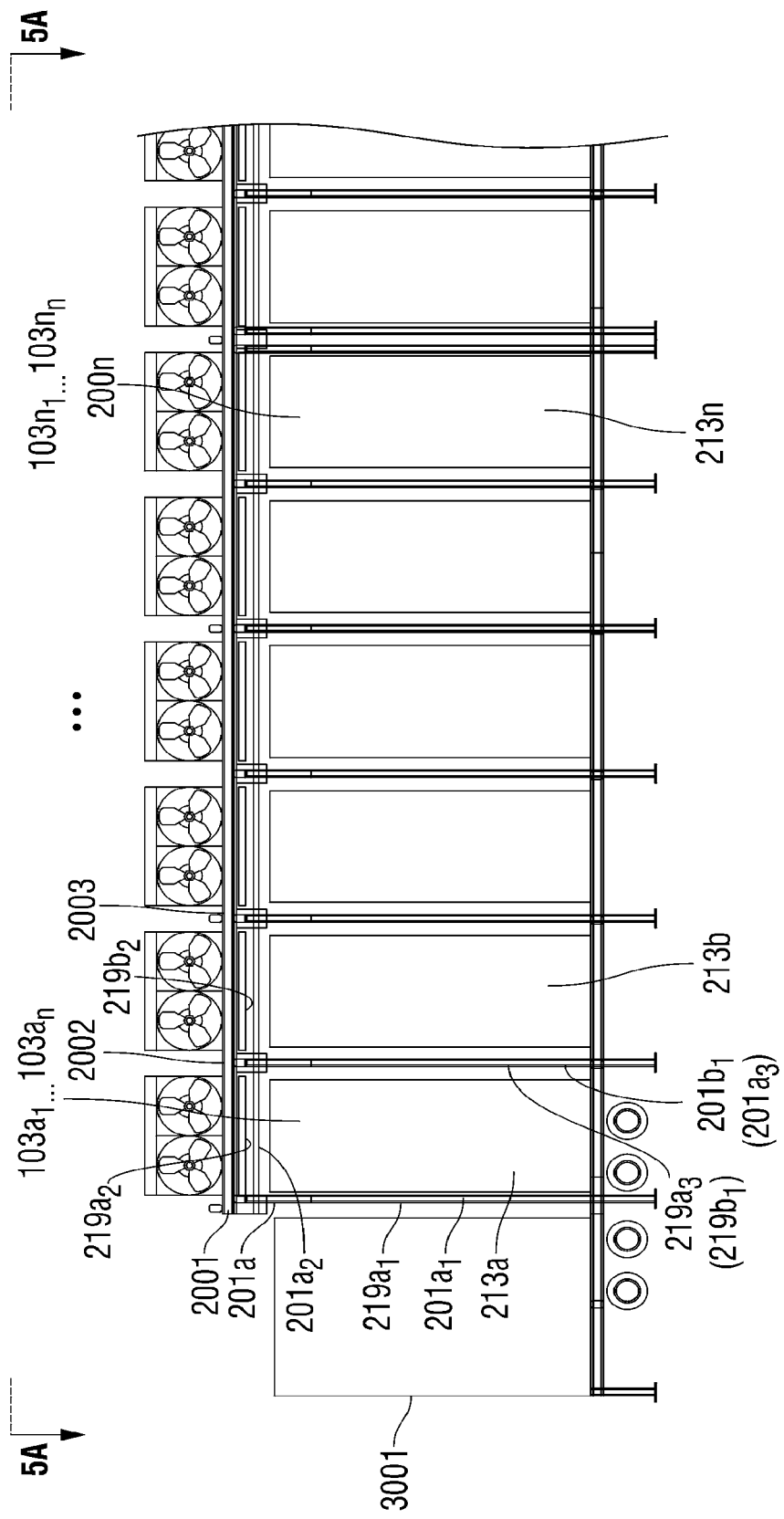
FIG. 4A is an elevation view of the data center assembly as taken along section line 4A-4A in FIG. 2 according to embodiments of the present disclosure.

As illustrated in FIG. 4A, the first supporting member 201a includes at least first, second and third beam members, $201a_1$, $201a_2$, and $201a_3$, respectively. The first beam member $201a_1$ is substantially orthogonally coupled to the second beam member $201a_2$, and the third beam member $201a_3$ is substantially orthogonally coupled to the second beam member $201a_2$ to form a substantially U-shaped configuration.

The modular server rack cooling structure 2001 further includes at least a second supporting member 202a which, as with first supporting member 201a, is exemplarily illustrated as a vertically-oriented beam positioned adjacent to the server rack 1002a at the rear end of the plurality of IT servers $102a_1$, . . . , $1012_n$, which as noted above, are positioned in different slots of the server rack 1002a.

Figure 4B:
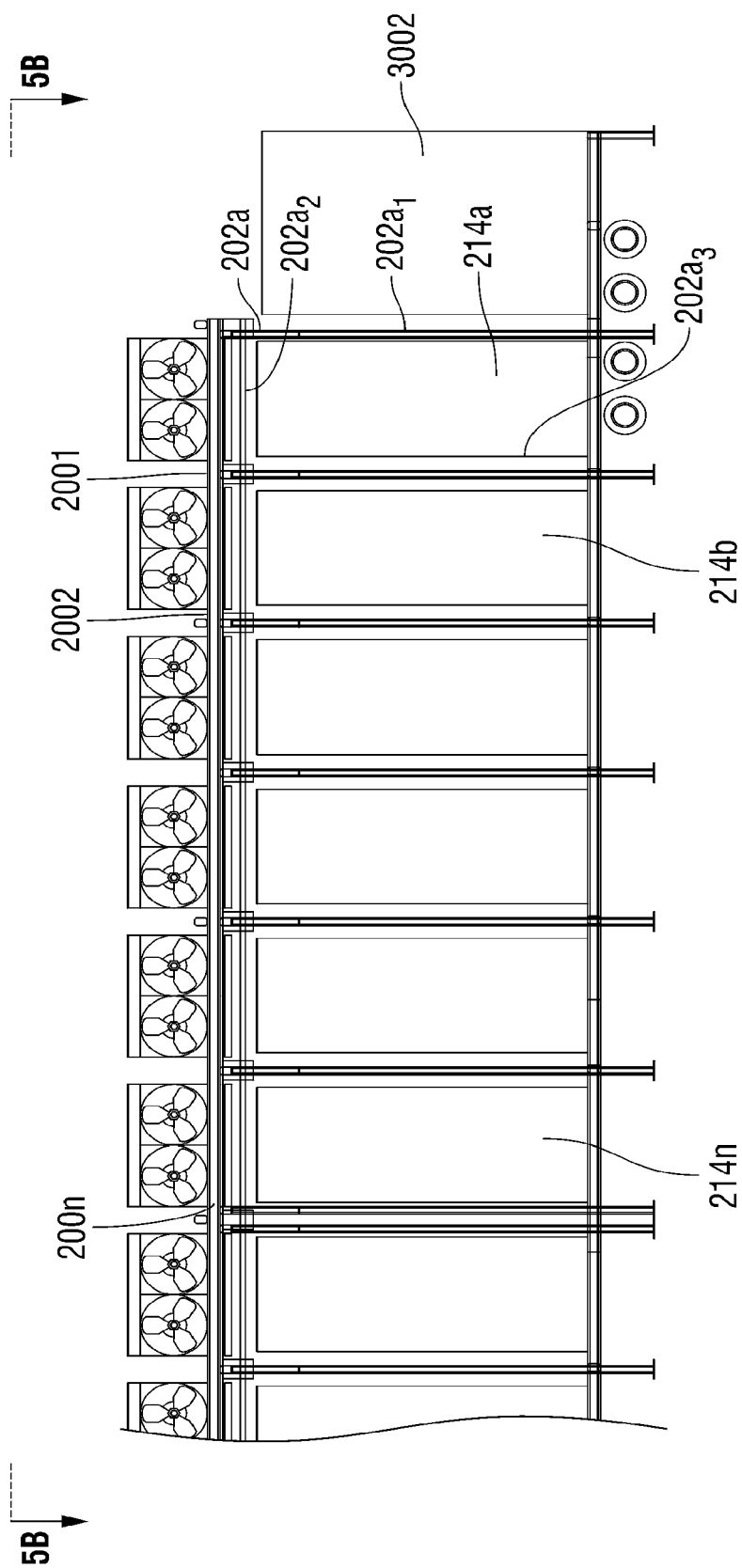
FIG. 4B is an elevation view of the data center assembly as taken along section line 4B-4B in FIG. 2 according to embodiments of the present disclosure.

As illustrated in FIG. 4B, and like the first supporting member 201a described with respect to FIG. 4A, the second supporting member 202a includes at least first, second and third beam members, $202a_1$, $202a_2$, and $202a_3$, respectively. The first beam member $202a_1$ is substantially orthogonally coupled to the second beam member $202a_2$, and the third beam member $202a_3$ is substantially orthogonally coupled to the second beam member $202a_2$ to form a substantially U-shaped configuration.

As illustrated in FIG. 3, when the modular server rack cooling structure 2001 includes the second supporting member 202a to provide stability and to enable practically simultaneous insertion of both the first heat exchanger 1101a and the second heat exchanger 1102a when the modular server rack cooling structure 2001 is installed in between the server racks 1001a and 1002a, the modular server rack cooling structure 2001 further includes at least a third supporting member 203a. In one embodiment, the third supporting member 203a couples the first supporting member 201a to the second supporting member 202a at upper ends 201a' and 202a' of the supporting members 201a and 202a, respectively.

Figure 5A:
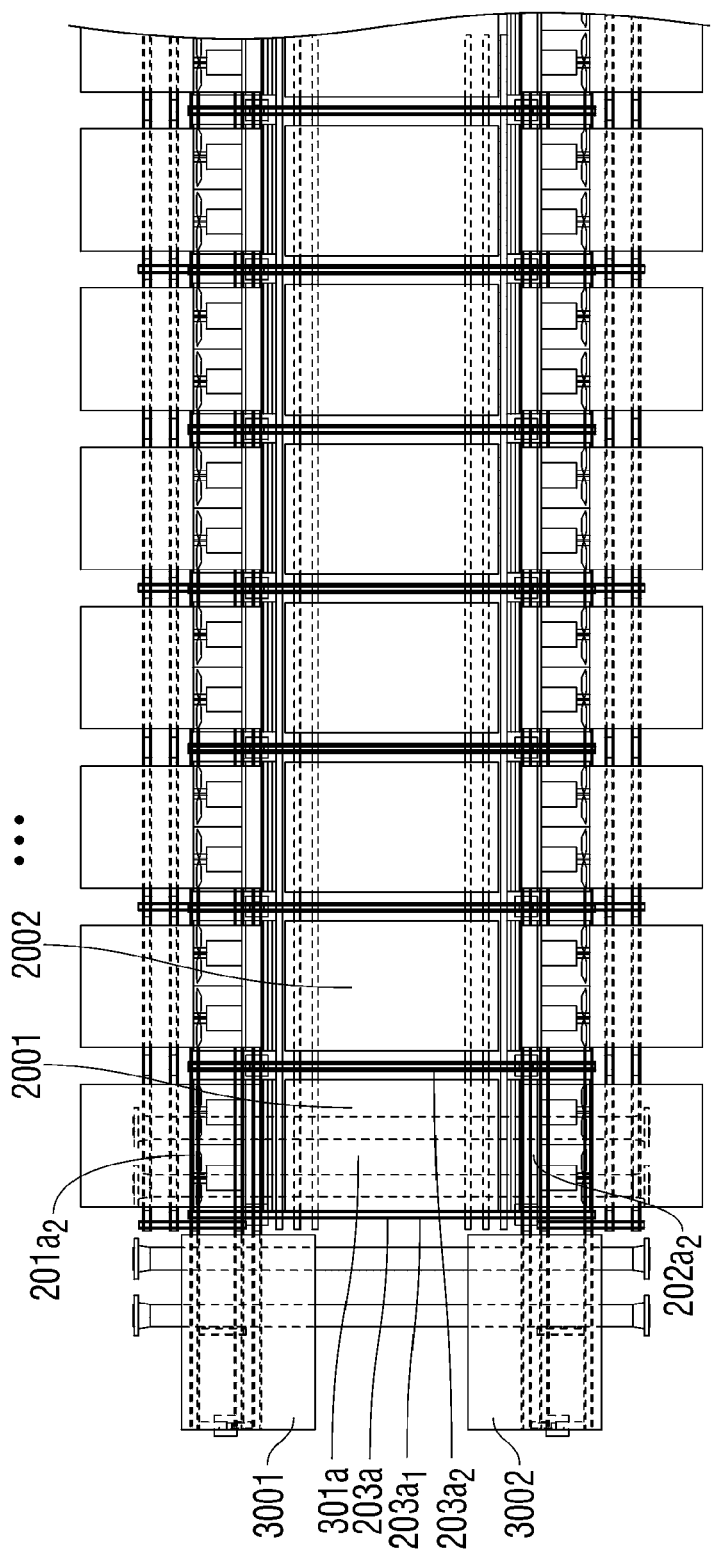
FIG. 5A is a plan view of the data center assembly of FIG. 1 as seen in the direction of the arrows 5A-5B in FIG. 4A illustrating the plurality of modular support structures in the data center assembly according to embodiments of the present disclosure.
Figure 5B:
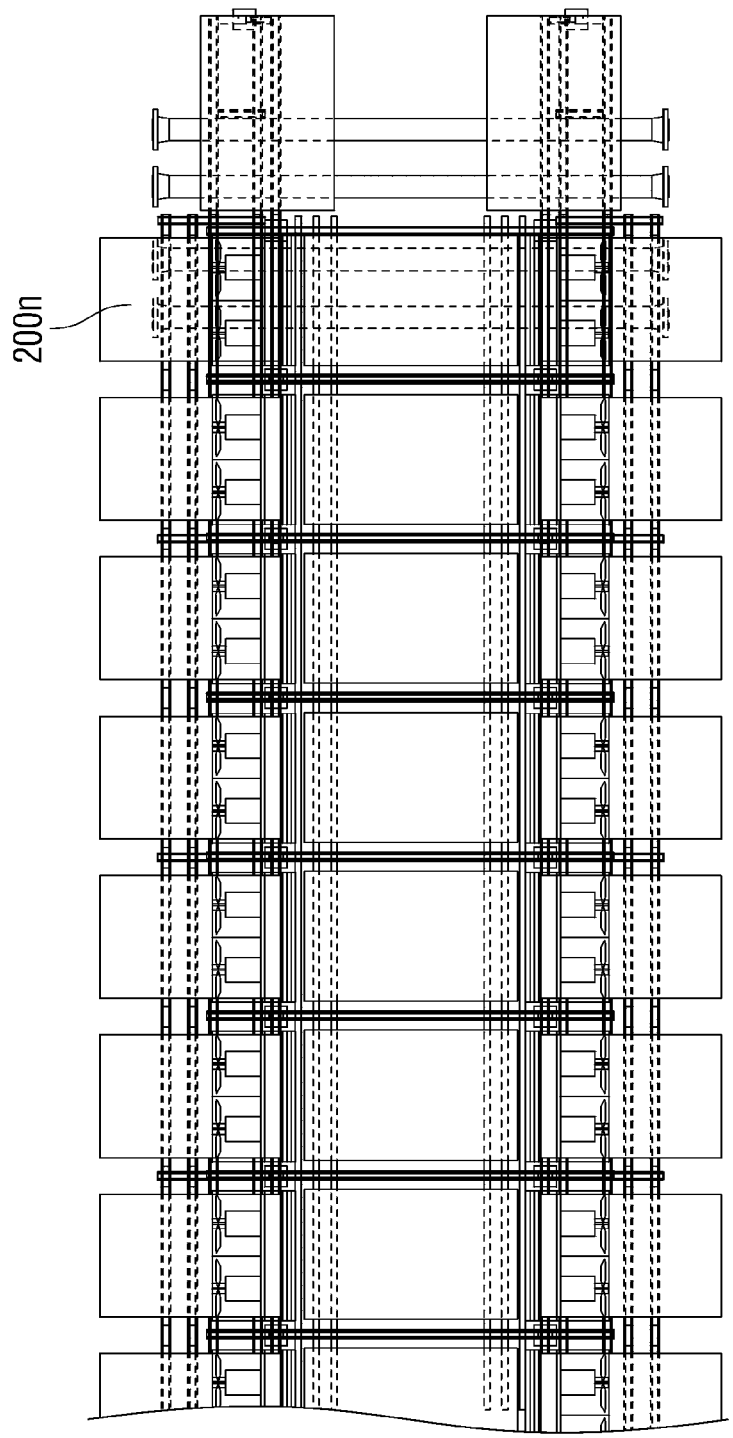
FIG. 5B is a plan view of the data center assembly of FIG. 1 as seen in the direction of the arrows 5B-5B in FIG. 4B illustrating the plurality of modular support structures in the data center assembly according to embodiments of the present disclosure.

As illustrated in FIG. 5A, the third supporting member 203a includes at least two beam members $203a_1$ and $203a_2$ that are each configured and disposed to span across the hot aisle 12 to couple the first supporting member 201a to the second supporting member 202a and to couple second supporting beam $201a_2$ of the first supporting member 201a to second supporting beam $202a_2$ of the second supporting member 202a.

As illustrated in FIG. 3, the third supporting member 203a includes at least one heat exchanger configured to transfer heat to or from the hot aisle following insertion of the modular server rack cooling structure 2001 in between the server racks 1001a and 1002a. More particularly, the third supporting member includes a third heat exchanger 301a supported substantially horizontally across and above the hot aisle 12.

The third heat exchanger 301a is a serpentine coil microchannel design similar to the first heat exchanger 213a and the second heat exchanger 214a has a thin rectangular configuration forming two large substantially flat sides such as the Model SX-2 Serpentine Coil heat exchanger manufactured by MBA Manufacturing and Supply Co. of Mundelein, Ill., USA or similar, described previously above. The horizontal positioning of third heat exchanger 301a across and above the hot aisle 12 enables significantly increased cooling capacity per unit area without an increase in the size of the cooling capacity footprint. The air exhausted horizontally from the IT servers in the server racks 1001a and 1002a into hot aisle 12 is forced to rise in the hot aisle 12 and is passed vertically through the serpentine coils of the third heat exchanger 301a.

As described below with respect to FIG. 9, to enable access to the space above the horizontal heat exchanger 301a, particularly for maintenance activities, in some embodiments, the horizontal heat exchanger 301a is rotatably coupled to the second beam member $201a_2$ via a hinged connection 303a so that the horizontal heat exchanger 301a can be rotated downwardly into the upper portion of the hot aisle 12.

In one embodiment, at least a first heat exchanger 213a is coupled to the first supporting member 201a. In one embodiment, the first heat exchanger 203a is a serpentine coil microchannel design having a thin rectangular configuration forming two large substantially flat sides such as a Model SX-2 Serpentine Coil heat exchanger manufactured by MBA Manufacturing and Supply Co. of Mundelein, Ill., USA or similar.

The first heat exchanger 213a has a first substantially flat side 215a and a second substantially flat side 217a through which hot air from the servers in the server racks can flow across the serpentine coils for cooling. Consequently, the first supporting member 201a is configured to position the first heat exchanger 213a in proximity to the heat transfer path $103a_1$ of at least server $101a_1$ via the first substantially flat side 215a following insertion of the modular server rack cooling structure in between the server racks 1001a and 1002a. In some embodiments, there may be no or minimal contact between the modular server rack cooling structure 2001 and the server racks 1001a and 1002a.

The first substantially flat surface 215a is positioned to interface with, and is in proximity to, the heat transfer path 103a of at least server $101a_1$ following insertion of the modular server rack cooling structure 2001 in between the server racks 1001a and 1002a. Air flow exhausted through the heat transfer path $103a_1$ of at least server $101a_1$ therefore flows to the first substantially flat side 215a of the first heat exchanger 213a across the coils to the second substantially flat side 217a into the hot aisle 12. In other words, at least the first supporting member 201a is configured to position at least the first heat exchanger 213a in heat transfer relationship with the one or more servers $101a_1, \ldots, 101a_n$. Also, at least the first heat exchanger 213a is not attached to the one or more IT server racks 1001a, . . . , 1001n.

As can be appreciated, the first heat exchanger 213a is configured and sized such that the substantially flat surfaces 215a and 217a at least partially, if not entirely, overlap the heat transfer paths $103a_1, \ldots, 103a_n$ of each of the plurality of IT servers $101a_1, \ldots, 101a_n$, respectively, that are positioned in different slots of the server rack 1001a.

In one embodiment, the first heat exchanger 213a has a dimension defining an edge $219a_1$ substantially interfacing with the first beam member $201a_1$, an edge $219a_2$ substantially interfacing with second beam member $201a_2$, and an edge $219a_3$ substantially interfacing with third beam member $201a_3$. One of the edges $219a_1$, $219a_2$ or $219a_3$ is rotatably coupled to the respective beam member $201a_1$, $201a_2$ or $201a_3$ such as by hinges $211a_1$ illustrated for beam member $201a_1$ and edge $219a_1$. (The hinges for beam members $201a_2$ and $201a_3$ and edges $219a_2$ and $219a_3$ are not shown). Thus, the first heat exchanger 213a may be rotated into the hot aisle 12 to enable access to the IT servers $101a_1, \ldots, 101a_n$ from the hot aisle 12 (as shown by the dashed line designated by reference numeral 213a).

As can be appreciated, the dimensions defining edges $219a_1$ and $219a_3$ are substantially longitudinal to coincide with the orientation of first beam member $201a_1$ and third beam member $201a_3$, respectively. Similarly, the dimension defining edge $219a_2$ is substantially lateral to coincide with the orientation of second beam member $201a_2$.

In one embodiment, the modular server rack cooling structure 2001 further includes at least a second supporting member 202a which, like the first supporting member 201a, is exemplarily illustrated as a vertically-positioned beam positioned adjacent to the server rack 1002a at the rear end of the plurality of IT servers $102a_1, \ldots, 1012_n$, which as noted above, are positioned in different slots of the server rack 1002a.

As with the first supporting member 201a, at least a second heat exchanger 214a is coupled to the second supporting member 202a. Again, in some embodiments, the second heat exchanger 214a is a serpentine coil microchannel design having a thin rectangular configuration forming two large substantially flat sides such as the Model SX-2 Serpentine Coil heat exchanger manufactured by MBA Manufacturing and Supply Co. of Mundelein, Ill., USA or similar.

The second heat exchanger 214a has a first substantially flat side 216a and a second substantially flat side 218a through which hot air from the servers in the server racks can flow across the serpentine coils for cooling. Consequently, the second supporting member 202a is configured to position the second heat exchanger 214a in proximity to the heat transfer path $104a_1$ of at least server $102a_1$ following insertion of the modular server rack cooling structure 2001 in between the server racks 1001a and 1002a. In some embodiments, there may be no or little contact between the modular server rack cooling structure 2001 and the server racks 1001a and 1002a.

The first substantially flat surface 216a is positioned to interface with, and is in proximity to, the heat transfer path $104a_1$ of at least server $102a_1$ following insertion of the modular server rack cooling structure 2001 in between the server racks 1001a and 1002a. Air flow exhausted through the heat transfer path $104a_1$ of at least server $102a_1$ therefore flows to the first substantially flat side 201a of the second heat exchanger 214a across the coils to the second substantially flat side 218a into the hot aisle 12. In other words, at least the second supporting member 202a is configured to position at least the second heat exchanger 214a in heat transfer relationship with the one or more servers $102a_1, \ldots, 102a_n$. Also, at least the second heat exchanger 214a is not attached to the one or more IT server racks 1002a . . . 1002n.

Again, as can be appreciated, second heat exchanger 214a generally is configured and sized such that the substantially flat surfaces 216a and 218a at least partially, if not entirely, overlap the heat transfer paths $104a_1, \ldots, 104a_n$ of each of the plurality of IT servers $102a_1, \ldots, 102a_n$, respectively, that are positioned at different elevation levels in server rack 1002a.

Those skilled in the art will recognize that the second heat exchanger 214a can also be rotatably mounted on hinges to be rotated into the hot aisle 12 to enable access to the IT servers $102a_1, \ldots, 201a_n$ from the hot aisle 12.

In one embodiment, as illustrated in FIG. 4B, in a similar manner as with respect to the first supporting member 201a described with respect to FIG. 4A, the second supporting member 202a includes at least first, second and third beam members, $202a_1$, $202a_2$, and $202a_3$, respectively. The first beam member $202a_1$ is substantially orthogonally coupled to the second beam member $202a_2$, and the third beam member $202a_3$ is substantially orthogonally coupled to the second beam member $202a_2$ to form a substantially U-shaped configuration.

As illustrated in FIG. 3, in one embodiment, when the support structure of the first modular server rack cooling structure 2001 includes the second supporting member 202a, to provide stability and to enable practically simultaneous insertion of both the first heat exchanger 213a and the second heat exchanger 214a when the modular server rack cooling structure 2001 is installed in between the server racks 1001a and 1002a, the support structure of the modular server rack cooling structure 2001 further includes at least a third supporting member 203a. In one embodiment, the third supporting member 203a couples the first supporting member 201a to the second supporting member 202a at upper ends 201a' and 202a' of the supporting members 201a and 202a, respectively.

As illustrated in FIG. 5A, the third supporting member 203a includes generally at least two beam members $203a_1$ and $203a_2$ that are each configured and disposed to span across the hot aisle 12 to couple the first supporting member 201a to the second supporting member 202a and generally to couple second supporting beam $201a_2$ of the first supporting member 201a to second supporting beam $202a_2$ of the second supporting member 202a.

Thus, the support structure of the first modular server rack cooling structure 2001 is configured to position the first heat exchanger 213a in proximity to at least the heat transfer path $103a_1$ of the at least first server $101a_1$ of the at least first rack 1001a following insertion of the modular server rack cooling structure 2001 in between the server racks 1001a and 1002a. In other words, at least the third supporting member 203a is configured to position at least the first heat exchanger 213a in heat transfer relationship with the one or more servers $101a_1$ ... $101a_n$. Also, at least the first heat exchanger 213a is not attached to the one or more IT server racks 1001a ... 1001n.

At the same time, the support structure of the first modular server rack cooling structure 2001 is configured to position the second heat exchanger 214a in proximity to at least the heat transfer path $104a_1$ of the at least first server $102a_1$ of the at least second rack 1002a following insertion of the support structure of the modular server rack cooling structure 2001 in between the server racks 1001a and 1002a. In other words, at least the second supporting member 202a is configured to position at least the second heat exchanger 214a in heat transfer relationship with the one or more servers $102a_1$ ... $102a_n$. Also, at least the second heat exchanger 214a is not attached to the one or more IT server racks 1002a ... 1002n.

As illustrated in FIG. 3, the third supporting member 203a supports at least one heat exchanger configured to transfer heat to or from the aisle following insertion of the modular server rack cooling structure 2001 in between the server racks 1001a and 1002a. More particularly, the third supporting member supports the third heat exchanger 301a substantially horizontally across and above the hot aisle 12.

Again, third heat exchanger 301a may be a serpentine coil microchannel design (similar to the first heat exchanger 213a and the second heat exchanger 214a) having a thin rectangular configuration forming two large substantially flat sides such as the Model SX-2 Serpentine Coil heat exchanger manufactured by MBA Manufacturing and Supply Co. of Mundelein, Ill., USA or similar. The horizontal positioning of third heat exchanger 301a across and above the hot aisle 12 enables significantly additional cooling capacity per unit area without an increase in the size of the cooling capacity footprint. In this embodiment, the air exhausted horizontally from the first and second heat exchangers 213a and 214a into hot aisle 12 is forced to rise in the hot aisle 12 and pass vertically through the serpentine coils of the third heat exchanger 301a.

In one embodiment, the third supporting member 203a may support the third heat exchanger 301a and/or a fourth heat exchanger 401a that is similar to the types described above with respect to the first, second and third heat exchangers 213a, 214a and 301a. The fourth heat exchanger 401a has a dimension defining a first edge 411a and an opposing second edge 412a wherein the fourth heat exchanger 401a is rotatably coupled to, and supported by, either the third supporting member 203a, or is rotatably coupled to second beam member $201a_2$ of the first supporting member 201a. The fourth heat exchanger 401a thus at least partially extends over the hot aisle 12 at an angle $\theta_1$ to the horizontal.

In one embodiment, the third supporting member 203a supports the fourth heat exchanger 401a and a fifth heat exchanger 502a that is similar to the types described above with respect to the first, second and third heat exchangers 213a, 214a and 301a, and is symmetrically identical to the fourth heat exchanger 401a. The fifth heat exchanger 502a also has a dimension defining a first edge 511a wherein the fifth heat exchanger 502a is rotatably coupled to, and supported by, either the third supporting member 203a, or is rotatably coupled to second beam member $202a_2$ of the second supporting member 202a. The fifth heat exchanger 502a thus at least partially extends over the hot aisle 12 at an angle $\theta_2$ to the horizontal.

In some situations, it may be desirable to transfer heat into the data center assembly 10 through the hot aisle 12. Those skilled in the art will recognize that by reversal of the direction of air flow and by supplying a fluid medium to the heat exchangers at a temperature above ambient, such heat transfer into the data center can be achieved.

Those skilled in the art will recognize that the sequence of installation of the aforementioned heat exchangers onto the support structure of the first modular server rack cooling structure 2001 can be varied according to the heat removal capacity requirements or other factors as desired. Additionally, those skilled in the art will recognize that a sequence wherein the first heat exchanger 213a and the second heat exchanger 214a are the first heat exchangers installed on the modular support structure 2001 enables, at least during initial operation of the data center assembly 10, elimination of hot aisle 12 since the first heat exchanger 213a and the first supporting member 201a are configured to enable direct interface, via the first substantially flat side 215a, of the first heat exchanger 213a in proximity to the heat transfer path $103a_1$ of at least server $101a_1$ and since second heat exchanger 214a and the first supporting member 202a are configured to enable direct interface, via the first substantially flat side 216a, of the second heat exchanger 214a in proximity to the heat transfer path $104a_1$ of at least server $102a_1$ As a result, only air that has already been cooled by the first and second heat exchangers 213a and 214a is circulated into the central aisle designated as hot aisle 12.

In one embodiment, as can be appreciated from FIGS. 1-5B, the present disclosure relates also to a system 50 that allows for the insertion and removal of the plurality of heat exchangers $213a, \ldots, 213n$ and $214a, \ldots, 214n$. As described above, the data center assembly 10 includes at least two racks $1001a, \ldots, 1001n$ and/or $1002a, \ldots, 1002n$. Each rack supports at least one server $101a_1, \ldots, 101a_n, \ldots, 101n_1, \ldots, 101n_n$ and/or $102a_1, \ldots, 102a_n, \ldots, 102n_1, \ldots, 102n_n$ having at least one heat transfer path $103a_1, \ldots, 103a_n, \ldots, 103n_1, \ldots, 103n_n$ and/or $104a_1, \ldots, 104a_n, \ldots, 104n_1, \ldots, 104n_n$. The sequence of installation of the aforementioned heat exchangers onto the support structure of the modular server rack cooling structure 2001 can be varied according to the heat removal capacity requirements or other factors as desired.

System 50 includes a support structure of the modular server rack cooling structure 2001 that is configured and disposed to support at least one forced-flow cooling device 1051a, e.g., the motorized fan, to provide forced-flow circulation from the hot aisle 12 directed toward the first cold aisle 141. The forced-flow cooling device 1051a is again configured and disposed to define a region of separation between the hot aisle 12 and the first cold aisle 141 of the data center assembly 10. The first forced-flow cooling device 1051a includes suction side 15a and discharge side shown by the arrow 17a, which indicates the direction of air flow. Since the first forced-flow cooling device 1051a is illustrated as being positioned vertically above the IT server rack 1001a, the region of separation is defined along the height of the first forced-flow cooling device 1051a above the IT server rack 1001a and therefore the region of separation occurs between the hot aisle 12 and the volume of space above the first row 1001' of IT server racks leading into the first cold aisle 141.

In one embodiment (not shown), the first forced-flow cooling device 1051a is positioned horizontally across the hot aisle 12 in proximity to the top of the IT server rack 1001a.

In one embodiment, the support structure of the modular server rack cooling structure 2001 is configured and disposed to support at least one heat exchanger. The first heat exchanger 1101a is configured and disposed with respect to the suction side 15a of the forced-flow cooling device 1051a to provide forced-flow cooling of the first heat exchanger 1101a. In some embodiments, the first heat exchanger 1101a is a serpentine coil microchannel design having a thin rectangular configuration forming two large substantially flat sides such as a Model SX-2 Serpentine Coil heat exchanger manufactured by MBA Manufacturing and Supply Co. of Mundelein, Ill., USA or similar.

The first heat exchanger 1101a has a first substantially flat side 1103a and a second substantially flat side 1105a. As illustrated in the exemplary embodiment of FIG. 3, the first heat exchanger 1101a is disposed in proximity to the suction side 15a of the first forced-flow cooling device 1051a. The first forced-flow cooling device 1051a is configured and disposed to maintain the region of separation between the hot aisle 12 and the first cold aisle 141 and to enable cooling of the hot air in the hot aisle 12 that emanates from the servers in the server racks and which flows across the serpentine coils of the first heat exchanger 1101a for cooling.

In one embodiment, the support structure of the modular server rack cooling structure 2001 is configured and disposed to support at least the second forced-flow cooling device 1052a, e.g., a motorized fan, to provide forced-flow circulation from the hot aisle 12 directed towards the second cold aisle 142. The second forced-flow cooling device 1052a is configured and disposed to define a region of separation between the hot aisle 12 and the second cold aisle 142.

The second forced-flow cooling device 1052a includes a suction side 16a and a discharge side shown by the arrow 18a, which indicates the direction of air flow. As with the first forced-flow cooling device 1051a, since the second forced-flow cooling device 1052a is illustrated as being positioned vertically above the IT server rack 1002a, the region of separation is defined along the height of the second forced-flow cooling device 1052a. In one embodiment (not shown), the second forced-flow cooling device 1052a is positioned horizontally across the hot aisle 12 in proximity to the top of the IT server rack 1002a.

The second heat exchanger 1102a is configured and disposed with respect to the suction side 16a of the forced-flow cooling device 1052a to provide forced-flow cooling of the second heat exchanger 1102a. In some embodiments, the second heat exchanger 1102a is a serpentine coil microchannel design having a thin rectangular configuration forming two large substantially flat sides such as the Model SX-2 Serpentine Coil heat exchanger manufactured by MBA Manufacturing and Supply Co. of Mundelein, Ill., USA or similar.

The second heat exchanger 1102a has the first substantially flat side 1104a and the second substantially flat side 1106a. As illustrated in the exemplary embodiment of FIG. 3, the second heat exchanger 1102a is disposed in proximity to the suction side 16a of the second forced-flow cooling device 1052a. The second forced-flow cooling device 1052a is configured and disposed to maintain the region of separation between the hot aisle 12 and the second cold aisle 142 and to enable cooling of the hot air in the hot aisle 12 that emanates from the servers in the server racks and which flows across the serpentine coils of the second heat exchanger 1102a for cooling.

The system 50 also includes a support structure of the modular server rack cooling structure 2001 that includes the first supporting member 1001a for supporting at least a first heat exchanger 213a. The first heat exchanger 213a is coupled to the first supporting member 201a. As described above, the first supporting member 201a is configured to position the first heat exchanger 213a in proximity to the one or more heat transfer paths $103a_1, \ldots, 103a_n$ of the one or more servers $101a_1, \ldots, 101a_n$ of the first rack 1001a following insertion of the modular server rack cooling structure 2001 in between the server racks 1001a and 1002a.

In other words, at least the first supporting member 201a is configured to position at least the first heat exchanger 213a in heat transfer relationship with the one or more servers $101a_1, \ldots, 101a_n$. Also, at least the first heat exchanger 213a is not attached to the one or more IT server racks $1001a \ldots 1001n$.

The system 50 also includes a support structure of the second modular server rack cooling structure 2002 that is identical or substantially identical to the support structure of the first modular server rack cooling structure 2001 described above for supporting at least one heat exchanger. As with the support structure of the first modular server rack cooling structure 2001, the support structure of the second modular server rack cooling structure 2002 includes a first supporting member 201b for supporting the at least a first heat exchanger 213b. The first heat exchanger 213b is coupled to the first supporting member 201b.

In a similar manner as described above, the first supporting member 201b is configured to position the first heat exchanger 213b in proximity to the one or more heat transfer paths $103b_1, \ldots, 103b_n$ of the one or more servers $101b_1, \ldots, 101b_n$ of the second rack 1001b following insertion of the modular server rack cooling structure 2002 in between the server racks 1001a and 1002a.

In other words, at least the first supporting member 201b is configured to position at least the first heat exchanger 213b in heat transfer relationship with the one or more servers $101b_1, \ldots, 101b_n$. Also, at least the first heat exchanger 213b is not attached to the one or more IT server racks $1001a, \ldots, 1001n$.

In one embodiment, the system 50 includes a support structure of the first modular server rack cooling structure 2001 further including at least a second supporting member 202a for supporting at least the second heat exchanger 214a. Again, the second supporting member 202a is configured to position the second heat exchanger 214a in proximity to one or more heat transfer paths $104a_1, \ldots, 104a_n$ of the one or more servers $102a_1, \ldots, 102a_n$ of at least third rack 1002a following insertion of the modular server rack cooling structure 2001 in between the server racks 1001a and 1002a. In other words, at least the second supporting member 202a is configured to position at least the second heat exchanger 214a in heat transfer relationship with the one or more servers $102a_1 \ldots 102a_n$. Also, at least the second heat exchanger 214a is not attached to the one or more IT server racks $1002a \ldots 1002n$.

In one embodiment, the data center assembly 10 includes at least a fourth rack 1002b for supporting servers $102b_1, \ldots, 102b_n$ having heat transfer paths $104b_1, \ldots, 104b_n$, respectively. The support structure of the modular server rack cooling structure 2002 further includes at least a second supporting member 202b. In a similar manner as described above, the second heat exchanger 214b is coupled to the second supporting member 202b.

The second supporting member 202b is configured to position the second heat exchanger 214b in proximity to the one or more heat transfer paths $104b_1, \ldots, 104b_n$ of the one or more servers $102b_1, \ldots, 102b_n$ of fourth rack 1002b following insertion of the second modular server rack cooling structure 2002 in between the server racks 1001a and 1002a. In other words, at least the second supporting member 202b is configured to position at least the second heat exchanger 214b in heat transfer relationship with the one or more servers $102b_1 \ldots 102b_n$. Also, at least the second heat exchanger 214b is not attached to the one or more IT server racks $1002a \ldots 1002n$.

In some embodiments, the support structure of the first modular server rack cooling structure 2001 is coupled to the support structure of the second modular server rack cooling structure 2002 and to support structures of succeeding modular server rack cooling structures 200n via mechanisms known in the art such as bolting or bracing. In one embodiment, each support structure is left in a free-standing independent position.

Again, in a similar manner as described above, the support structure of the first modular server rack cooling structure 2001 further includes at least a third supporting member, e.g., supporting member 203a. The third supporting member 203a couples the at least first supporting member 201a to the second supporting member 202a at upper ends 201a' and 202a' of the supporting members 201a and 202a, respectively. The support structure of the first modular server rack cooling structure 2001 is configured to position the at least first heat exchanger 213a in proximity to the one or more heat transfer paths $103a_1, \ldots, 103a_n$ of the one or more servers $101a_1, \ldots, 101a_n$ of the first rack 1001a and to position the at least second heat exchanger 214a in proximity to the one or more heat transfer paths $104a_1, \ldots, 104a_n$ of the one or more servers $102a_1, \ldots,$ $102a_n$ of the second rack 1002a following insertion of the first modular server rack cooling structure 2001 in between the server racks 1001a and 1002b.

In other words, the at least the third supporting member 203a is configured to position at least the first heat exchanger 213a in heat transfer relationship with the one or more servers $101a_1, \ldots, 101a_n$. Also, at least the first heat exchanger 213a is not attached to the one or more IT server racks $1001a, \ldots, 1001n$. Additionally, at least the third supporting member 203b is configured to position at least the second heat exchanger 214b in heat transfer relationship with the one or more servers $102a_1, \ldots, 102a_n$. Also, at least the second heat exchanger 214a is not attached to the one or more IT server racks $1002a, \ldots, 1002n$.

In a similar manner as described above, in one embodiment, the at least third supporting member 203a again includes at least one heat exchanger 301a configured to transfer heat to or from the aisle 12 following insertion of the modular server rack cooling structure 2001 in between the server racks 1001a and 1002a. The heat exchanger 301a has a dimension defining an edge to which the heat exchanger 301a is rotatably coupled, e.g., coupled to at least portions of the edge, to the third supporting member 203a.

Those skilled in the art will recognize that in one embodiment, the support structure of the second modular server rack cooling structure 2002 further includes at least a third supporting member 203b coupling the first supporting member 201b of the support structure of the second modular server rack cooling structure 2002 to the second supporting member 202b of the support structure of the second modular server rack cooling structure 2002. The support structure of the second modular server rack cooling structure 2002 is configured to position the at least first heat exchanger 213b in proximity to the one or more heat transfer paths $103b_1, \ldots, 103b_n$ of the one or more servers $101b_1, \ldots,$ $101b_n$ of the first rack 1001b and to position the at least second heat exchanger 214b in proximity to the one or more heat transfer paths $104b_1, \ldots, 104b_n$ of the one or more servers $102b_1, \ldots, 102b_n$ of the second rack 1002b following insertion of the modular server rack cooling structure 2002 in between the server racks 1001a and 1002a.

In other words, the second supporting member 202a is configured to position at least the second heat exchanger 214a in heat transfer relationship with the one or more servers $102a_1, \ldots, 102a_n$ Also, at least the second heat exchanger 214a is not attached to the one or more IT server racks $1002a, \ldots, 1002n$.

Those skilled in the art will recognize that the system 50 in various embodiments includes in the above described combinations the heat exchangers analogous to heat exchangers 213a, 214a, 301a, 401a and 502a, which are incorporated into the second and subsequent modular server rack cooling structure 2002, 2003, ..., 200n. Those skilled in the art will also recognize that the subsequent modular server rack cooling structures 2003, ..., 200n can be constructed in an identical manner as described in their entirety above and connected in a modular manner one to another as required depending on the number of servers and server racks and their cooling (or heating) requirements.

Figure 6:
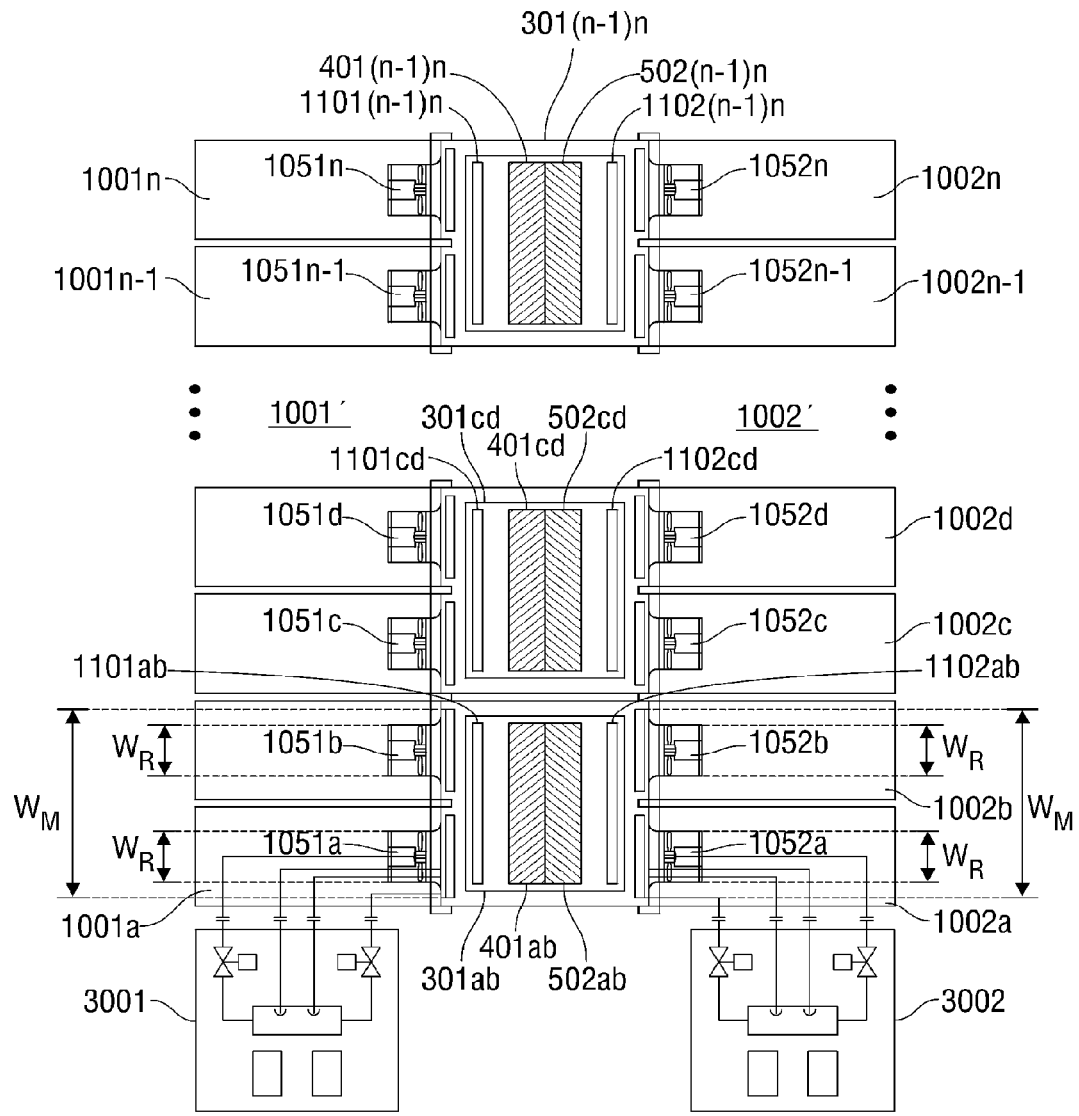
FIG. 6 is a plan view of a data center assembly according to embodiments of the present disclosure.

FIG. 6 illustrates a variation of the embodiments of the third, fourth and fifth heat exchangers 301a, 401a and 502a mounted on the modular support structures wherein said heat exchangers are configured to have a width dimension $W_M$ that generally exceeds the widths $W_R$ of each server rack $1001a, \ldots, 1001n$ and $1002a, \ldots, 1002n$ and/or of each server $101a_1, \ldots, 101a_n, \ldots, 101n_1, \ldots, 101n_n$ and/or $102a_1, \ldots, 102a_n, \ldots, 102n_1, \ldots, 102n_n$. As illustrated, the third, fourth and fifth heat exchangers have a width dimension $W_M$ that generally equals twice the width dimension $W_R$ of each server rack. Accordingly, the third heat exchangers are designated 301ab, 301cd, . . . , 301(n-1)(n), the fourth heat exchangers are designated 401ab, 401cd, . . . , 401(n-1)(n), and the fifth heat exchangers are designated 502ab, 502cd, . . . , 502(n1-1)(n). The forced-flow cooling devices 1051a through 1051n and 1052a through 1052n retain their original designation since only one device is shown dedicated to individual racks 1001a through 1001n and 1002a through 1002n, respectively. The first heat exchangers 1101a and 1101b are designated as 1101ab, heat exchangers 1101c and 1101d are designated as 1101cd and heat exchangers 1101n-1 and 1101n are designated as 1101(n-1)n.

Additionally, as illustrated in FIG. 2 and as known in the art, each heat exchanger has cooling fluid connections, e.g., piping conduits, that are coupled by flexible connections, as described below and as shown in more detail with respect to FIGS. 7-11. As exemplarily illustrated in FIGS. 4A, 5A, 6 and 7 and best illustrated in FIG. 6 and FIG. 7, the heat exchangers associated with the first row 1001' are fluidically coupled to a first cooling cycle skid 3001 while the heat exchangers associated with the second row 1002' are fluidically coupled to a second cooling cycle skid 3002. In one embodiment, the first and second cooling cycle skids 3001 and 3002, respectively, include a cooling cycle, such as that described in the aforementioned U.S. Provisional Patent Application No. 61/482,070, which was filed on May 3, 2011, the entire contents of which is incorporated by reference herein. Other cycles as known in the art also can be applied to the first and second cooling cycle skids 3001 and 3002 to fluidically couple to the heat exchangers. A description of the close-coupled cooling system as applied to first and second cooling cycle skids 3001 and 3002, respectively, is described below with reference to FIG. 12.

With respect to the connection of the modular support structures, referring to FIGS. 1-6, the present disclosure relates to a method for installing a support structure for supporting a plurality of heat exchangers in a data center, e.g., modular support structure 2001 for supporting heat exchangers 213a, 214a, 301a, 401a and/or 502a in data center assembly 10. The data center assembly 10 includes the plurality of racks 1001a, . . . , 1001n and 1002a, . . . , 1002n for supporting the plurality of servers each having at least one heat transfer path as described above. The method includes the steps of: providing a modular support structure, e.g., 2001 or 2002 . . . or 200n, including at least two heat exchangers, e.g., at least heat exchangers 213a and 214a and/or 213b and 214b and/or 213n and/or 214n, and installing the modular support structure, e.g., 2001 or 2002 . . . or 200n, to directly interface the at least two heat exchangers 213a and 214a and/or 213b and 214b . . . and/or 213n and 214n, with at least two respective heat transfer paths of the plurality of servers, e.g., one or more heat transfer paths $103a_1$, . . . , $103a_n$ and $104a_1$, . . . , $104a_n$ and/or $103b_1$, . . . , $103b_n$ and $104b_1$, . . . , $104b_n$ . . . and/or $103n_1$, . . . , $103n_n$ and $104n_1$, . . . , $104n_n$ of the one or more respective servers, e.g., servers $101a_1$, . . . , $101a_n$ and $102a_1$, . . . , $102a_n$ and/or $101b_1$, . . . , $101b_n$ and $102b_1$, . . . , $102b_n$ . . . and/or $101n_1$, . . . , $101n_n$ and $102n_1$, . . . , $102n_n$ of the respective first racks, e.g., racks 1001a, . . . , 1001n, and second racks, e.g., racks 1002a, . . . , 1002n, without contact between the respective modular support structure, e.g., modular support structures 2001, . . . , 200n, and the plurality of racks, e.g., racks 1001a, . . . , 1001n and 1002a, . . . , 1002n, and without contact between the respective modular support structure, e.g., modular support structures 2001, . . . , 200n, and the plurality of servers, e.g., servers $101a_1$, . . . , $101a_n$ and $102a_1$, . . . , $102a_n$ and/or $101b_1$, . . . , $101b_n$ and $102b_1$, . . . , $102b_n$ . . . and/or $101n_1$, . . . , $101n_n$ and $102n_1$, . . . , $102n_n$.

In one embodiment, the method also includes installing the third, fourth and fifth heat exchangers 301a, . . . , 301n, 401a, . . . , 401n and 502a, . . . , 502n in the respective support structures of the modular server rack cooling structures 2001, . . . , 200n in the manner as described above for the various embodiments.

Alternatively, in some embodiment, the present disclosure relates to a method of installing a modular server rack cooling structure for cooling at least a first server installed in at least a first rack and at least a second server installed in at least a second rack, e.g., modular server rack cooling structure 2001, 2002, . . . , 200n. The at least a first rack 1001a, . . . , 1001n and the at least a second rack 1002a, . . . , 1002n are disposed opposite each other to form a hot aisle 12 or a cold aisle. The method includes positioning at least a portion of the modular server rack cooling structure 2001, 2002, . . . , 200n in the hot aisle 12 or the cold aisle. The modular server rack cooling structure 2001, 2002, . . . , 200n includes at least a first support member 201a, . . . , 201n, a second support member 202a, . . . , 202n, and a third support member 203a, . . . , 203n, and coupling at least a first heat exchanger, e.g., heat exchanger 213a, . . . , 213n, to the at least a first supporting member 201a, . . . , 201n so that the at least a first heat exchanger 213a . . . 213n is positioned adjacent to the at least a first server $101a_1$, . . . , $101a_n$ of the at least a first rack 1001a; coupling at least a second heat exchanger, e.g., heat exchanger 214a, . . . , 214n, to the at least a second supporting member 202a, . . . , 202n so that the at least a second heat exchanger 214a, . . . , 214n is positioned adjacent to the at least a second server $102a_1$, . . . , $102a_n$ of the at least a second rack 1002a; and coupling at least a third heat exchanger, e.g., heat exchanger 301a, . . . , 301n to the at least a third supporting member 203a, . . . , 203n after at least a third server $101b_1$, . . . , $101b_n$ or $102b_1$, . . . , $121b_n$ is installed in the at least a first rack 1001a or the at least a second rack 1002a, respectively.

FIGS. 7-11 are operational schematics for the heat exchangers associated with the modular server rack cooling structure 2001, . . . , 200n described above showing a phased installation of the various heat exchangers added to the modular support structures as necessary to accommodate increased heat loads.

Figure 7:
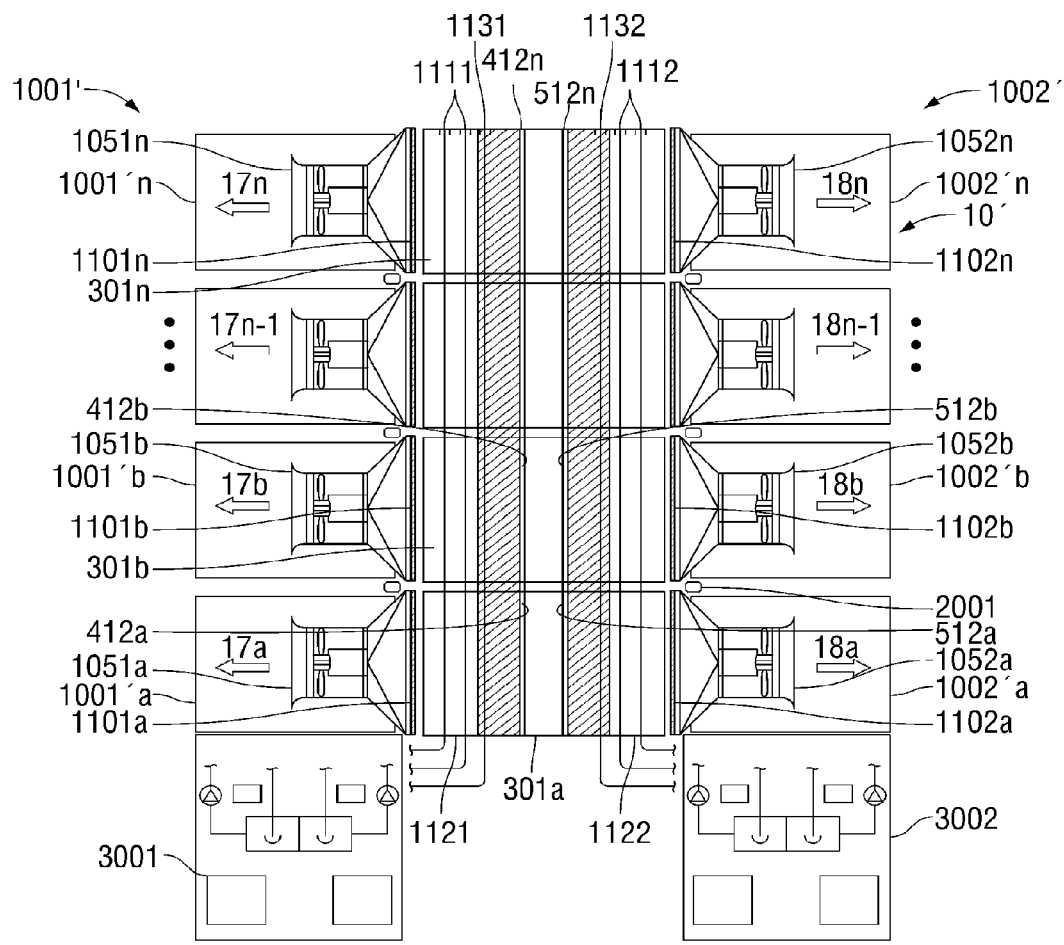
FIG. 7 is a plan view of a data center assembly according to embodiments of the present disclosure illustrating the fluid circuits between refrigeration heat exchanger skids and the heat exchangers supported by the modular support structures.

More particularly, FIG. 7 is an operational schematic plan view of a data center assembly 10' according to one embodiment of the present disclosure illustrating the fluid circuits between refrigeration heat exchanger skids and the heat exchangers supported by the modular server rack cooling structures. Data center assembly 10' is substantially identical to data center assembly 10 except that in FIG. 7, as compared to FIGS. 1, 4A and 4B, a single circulating exhaust fan 1051a, 1051b, . . . , 1051n and 1052a, 1052b, . . . , 1052n is associated with each rack 1001'a, 1001'b, . . . , 1001'n in first row 1001' and 1002'a, 1002'b, . . . , 1002'n in the second row 1002', respectively, mounted above each rack on respective support structures of the modular server rack cooling structures 2001, 2002, . . . , 200n, in contrast to the two exhaust fans per rack illustrated in FIGS. 1, 4A and 4B. Each exhaust fan 1051a, 1051b, . . . , 1051n and 1052a, 1052b, . . . , 1052n is positioned in proximity to respective primary exhaust heat exchangers 1101a, 1101b, . . . , 1101n and 1102a, 1102b, . . . , 1102n to cause air flow across each heat exchanger above each respective rack. The primary exhaust heat exchangers 1101a, 1101b, . . . , 1101n and 1102a, 1102b, . . . , 1102n again have a thin, rectangular configuration and are mounted substantially vertically and orthogonally with respect to the top surfaces of the racks.

Primary exhaust heat exchangers 1101a, 1101b, . . . , 1101n are fluidically coupled to first cooling cycle skid 3001 through a first primary cooling circuit 1111 and primary exhaust heat exchangers 1102a, 1102b, . . . , 1102n are fluidically coupled to second cooling cycle skid 3002 through a second primary cooling circuit 1112.

In one embodiment, again the third supporting member 203a includes third heat exchanger 301a supported substantially horizontally across and above the hot aisle 12. In this embodiment, the air exhausted horizontally from the first and second heat exchangers 213a and 214a into hot aisle 12 is forced to rise in the hot aisle 12 and pass vertically through the serpentine coils of the third heat exchanger 301a.

As illustrated in and described above with respect to FIG. 3, fourth heat exchanger 401a and, as illustrated in FIG. 7, an additional plurality of substantially identical thin, rectangularly configured heat exchangers 401b, . . . , 401n are positioned on the respective modular server rack cooling structures 2001, 2002, . . . , 200n above the hot aisle 12 and straddling the first row 1001' of racks. Thus, in a similar manner as described above with respect to FIG. 3, the fourth heat exchangers 401a, . . . , 401n at least partially extend over the hot aisle 12 at an angle $\theta_1$ to the horizontal.

Similarly, as illustrated in and described above with respect to FIG. 3, fifth heat exchanger 502a and, as illustrated in FIG. 7, an additional plurality of substantially identical thin, rectangularly configured heat exchangers 502b, . . . , 402n are positioned on the respective modular server rack cooling structures 2001, 2002, . . . , 200n above the hot aisle 12 and straddling the second row 1002' of racks. Again, in a similar manner as described above with respect to FIG. 3, the fifth heat exchangers 502a, . . . , 502n thus at least partially extend over the hot aisle 12 at an angle $\theta_2$ to the horizontal.

Figure 11:
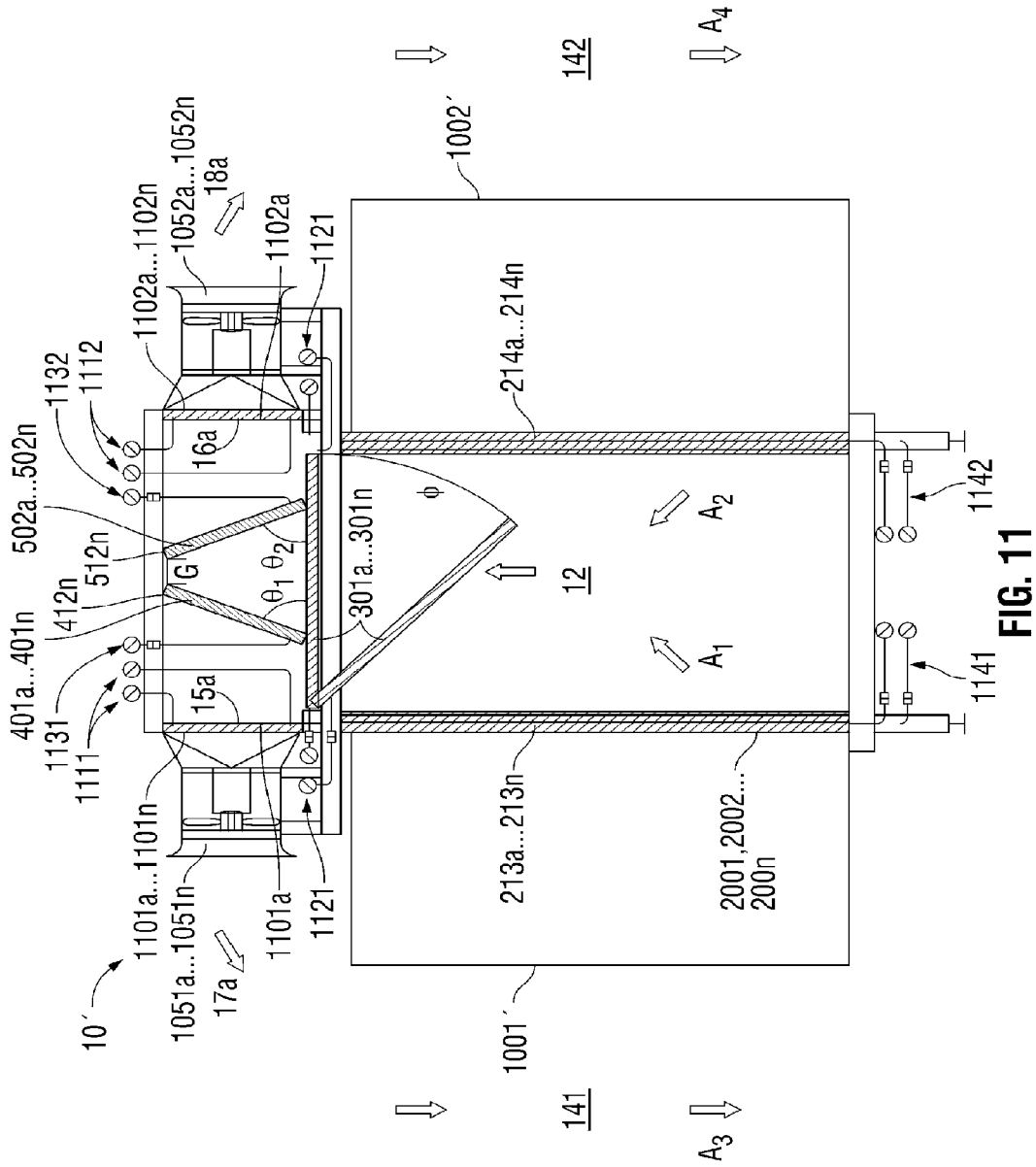
FIG. 11 is an operational end view of the data center assembly of FIG. 10 having at least one modular support structure and associated heat exchangers for high density operations according to embodiments of the present disclosure.

The angles $\theta_1$ and $\theta_2$ are generally equal and as illustrated in FIG. 3, and as shown in FIG. 11 discussed in more detail below, the fourth heat exchangers 401a, 401b, . . . , 401n and the fifth heat exchangers 502a, 502b, . . . , 502n form an "A-Frame" configuration when the second edges 412a, 412b, . . . , 412n of the respective fourth heat exchangers 401a, 401b, . . . , 401n and the second edges 512a, 512b, . . . , 512n of the respective fifth heat exchangers 502a, 502b, . . . , 502n are either in direct contact as shown in FIG. 3 or in close proximity as shown in FIG. 11.

Fourth heat exchangers 401a, 401b, . . . , 401n are fluidically coupled to first cooling cycle skid 3001 through a first "A-Frame" cooling circuit 1131 and fifth heat exchangers 502a, 502b, . . . , 502n are fluidically coupled to second cooling cycle skid 3002 through a second "A-Frame" cooling circuit 1132.

Figure 8:
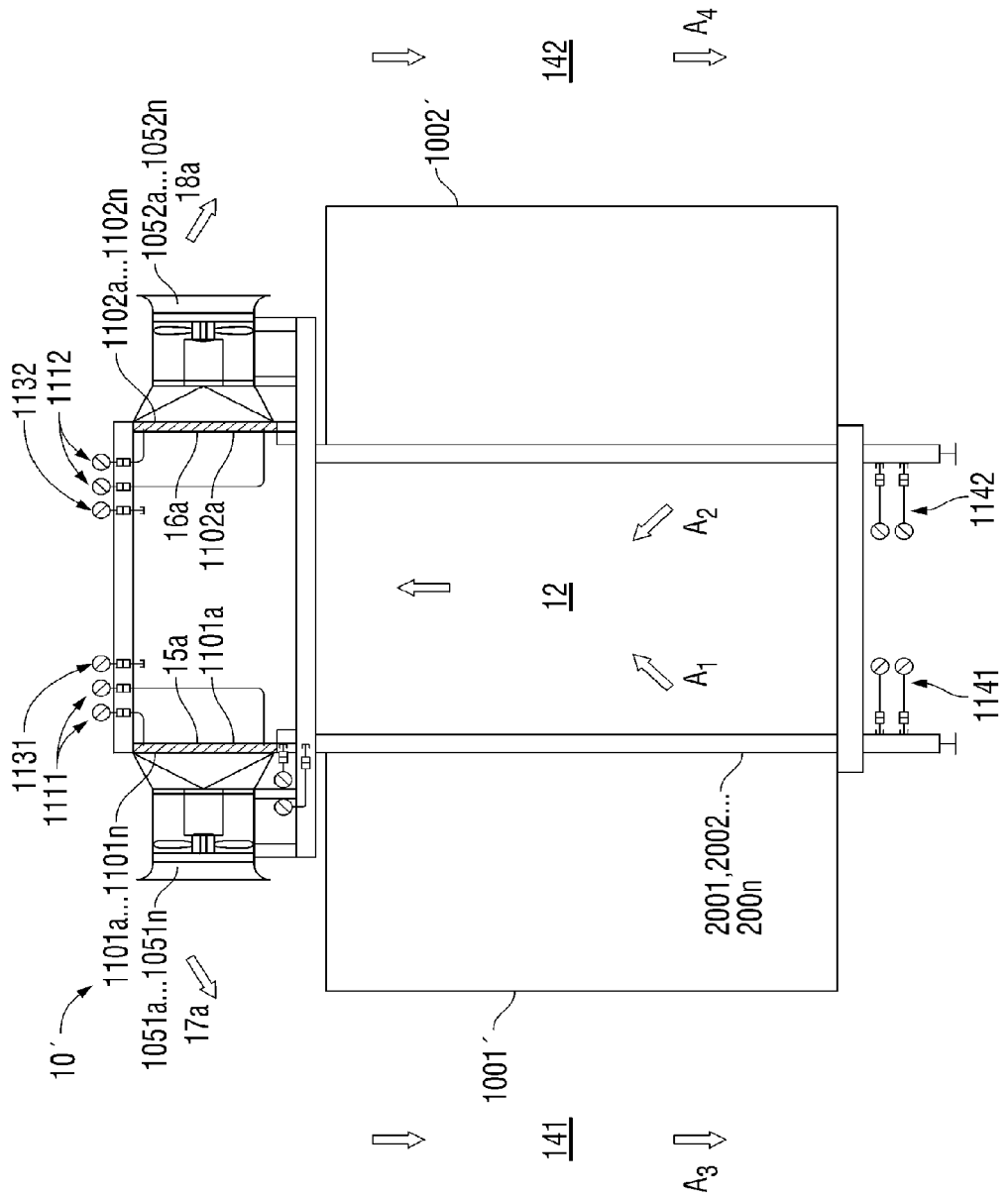
FIG. 8 is an operational end view of the data center assembly of FIG. 7 having at least one modular support structure and associated heat exchangers for "Day One" low density operation according to embodiments of the present disclosure.

FIG. 8 is an operational or installation schematic end view of the data center assembly 10' having at least one modular support structure and associated heat exchangers for "Day One" low density operation. More particularly, the data center assembly 10' forms a first cold aisle 141 between the outer structural walls of the data center (not shown) and the first row 1001' of IT server racks and a second cold aisle 142 between the outer structural walls of the data center (not shown) and the second row 1002' of the IT server racks. As illustrated above in FIG. 3, the servers in the server racks in the first row 1001' and the servers in the server racks in the second row each transfer heat into the common hot aisle 12.

In FIG. 8, the modular server rack cooling structures 2001, 2002, . . . , 200n are positioned in the hot aisle 12 with their associated heat exchangers in proximity to the heat transfer paths of the servers. Thus, during operation of the data center assembly 10', heat is generated in the servers from one or both rows of servers. The heat exhausts through the server heat transfer paths into the hot aisle 12 first passing through the associated vertically-mounted heat exchangers 213a, 213b, . . . , 213n and 213a, 213b, . . . , 213n of the modular server rack cooling structures 2001, 2002, . . . , 200n.

However, in the "low density" operational mode or "low density" phased installation illustrated in FIG. 8, the circulation cooling circuits (shown in FIG. 10 below) for the heat exchangers 213a, 213b, . . . , 213n and 214a, 214b, . . . , 214n of the modular server rack cooling structures 2001, 2002, . . . , 200n are either not installed or not in operation or both. As defined herein, "density" refers to a volumetric heat load per unit volume, such as in $KW/m^3$ (Kilowatts/cubic meter).

High temperature server exhaust air A1 and A2 enters the hot aisle 12 and is circulated vertically upward in the hot aisle and passes through the primary exhaust heat exchangers 1101a, 1101b, . . . , 1101n and respective exhaust fans 1051a, 1051b, . . . , 1051n and through primary exhaust heat exchangers 1102a, 1102b, . . . , 1102n and respective exhaust fans 1052a, 1052b, . . . , 1052n back to the respective cold aisles 141 and 142 to flow into the servers as cold air supplies A3 and A4, respectively.

As described above with respect to FIG. 7, primary exhaust heat exchangers 1101a, 1101b, . . . , 1101n are fluidically coupled to first cooling cycle skid 3001 through the first primary cooling circuit 1111 and primary exhaust heat exchangers 1102a, 1102b, . . . , 1102n are fluidically coupled to second cooling cycle skid 3002 through second primary cooling circuit 1112. The first and second primary cooling circuits 1111 and 1112, respectively, are in full or partial operation to remove the heat load from the data center assembly 10', as required. The cooling circuits for the remaining heat exchangers discussed with respect to FIG. 7 are not in operation due to the low magnitude of the heat load per unit volume.

Figure 9:
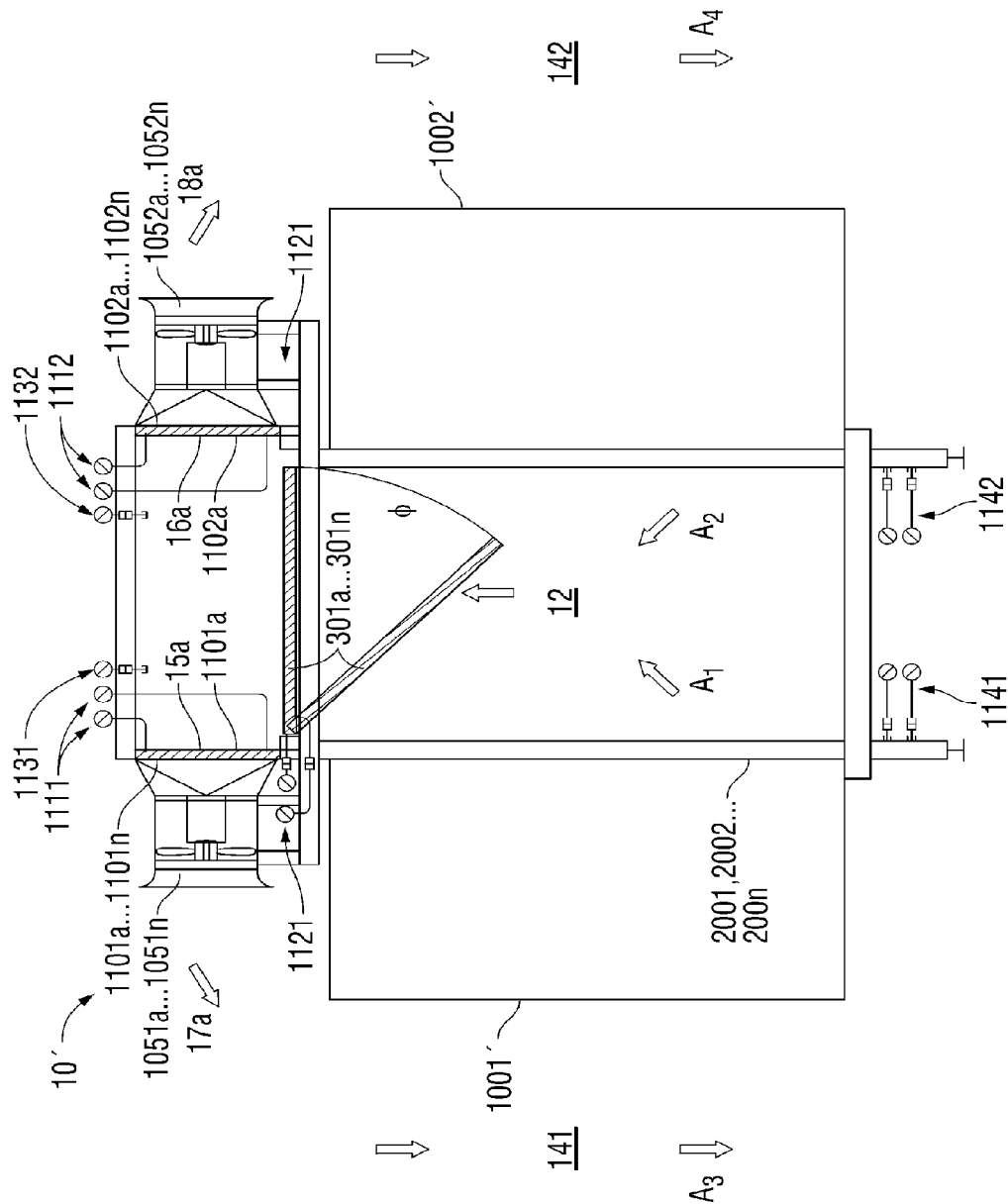
FIG. 9 is an operational end view of the data center assembly of FIG. 8 having at least one modular support structure and associated heat exchangers for "Day Two" increased density operation according to embodiments of the present disclosure.

FIG. 9 is an operational or installation schematic end view of the data center assembly 10' illustrated in FIG. 8 for "Day Two" "increased density" operation according to one embodiment of the present disclosure. The difference between the "increased density" operation illustrated in FIG. 9 and the "low density" operation described above with respect to FIG. 8 is that in FIG. 9, cooling circuit 1121 for horizontal heat exchangers 301a, 301b, . . . , 301n formed are also installed and in full or partial operation to further remove heat from the data center assembly 10', as required.

As previously described above, to enable access to the space above the horizontal heat exchanger 301a particularly for maintenance activities, in one embodiment, the horizontal heat exchanger 301a is rotatably coupled to the second beam member $201a_2$ via a hinged connection 303a such that the horizontal heat exchanger 301a can be reversibly rotated downwardly into the upper portion of the hot aisle 12 as shown by the angle $\phi$ below the horizontal.

Figure 10:
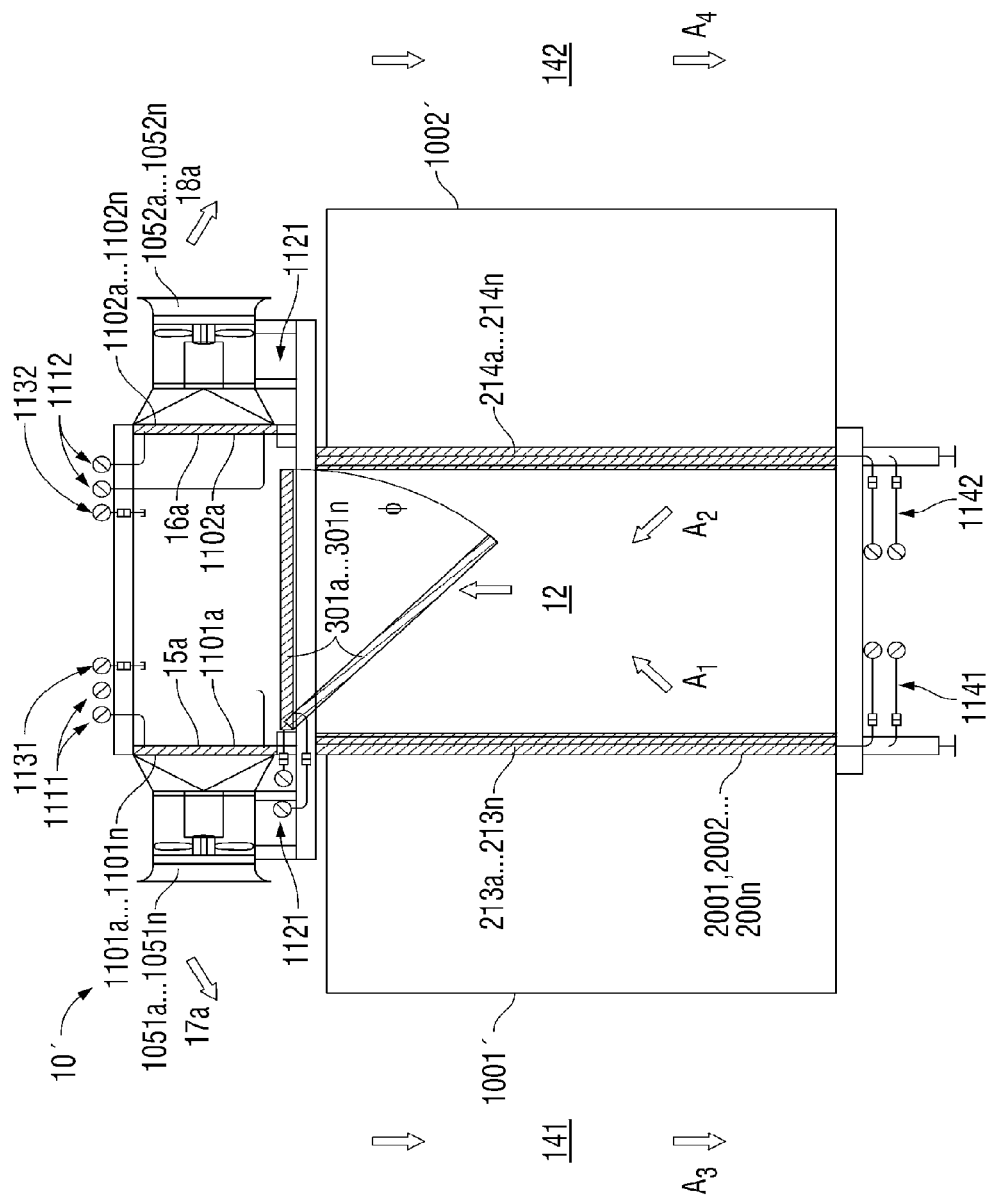
FIG. 10 is an operational end view of the data center assembly of FIG. 9 having at least one modular support structure and associated heat exchangers for "Day Three" increased density operation according to embodiments of the present disclosure.

FIG. 10 is an operational or installation schematic end view of the data center assembly 10' illustrated in FIG. 9 for "Day Three" increased density operation according to one embodiment of the present disclosure. The difference between the "Day Three" "increased density" operation illustrated in FIG. 10 and the "Day Two" "increased density"

operation described above with respect to FIG. 9 is that in FIG. 10, the first cooling circuit 1141 and the second cooling circuit 1142 for the respective first heat exchangers 213a, 213b, . . . , 213n and second heat exchangers 214a, 214b, . . . , 214n that are positioned in proximity to the one or more heat transfer paths of the one or more servers as described above with respect to FIGS. 3-6 are also installed to further remove heat from the data center assembly 10', as required.

FIG. 11 is an operational or installation schematic end view of the data center assembly 10' illustrated in FIG. 10 for "high density" operation according to one embodiment of the present disclosure. The difference between the "high density" operation illustrated in FIG. 11 and the "Day Two" "increased density" operation described above with respect to FIG. 10 is that in FIG. 11, as described above with respect to FIGS. 3 and 7, the first and second cooling circuits 1131 and 1132 for the respective "A-Frame" fourth heat exchangers 401a, 401b, . . . , 401n and fifth heat exchangers 502a, 502b, . . . , 502n are installed and in full or partial operation to further remove heat from the data center assembly 10', as required. As shown in the exemplary embodiment of FIG. 11, the second edges 412a, 412b, . . . , 412n of the respective fourth heat exchangers 401a, 401b, . . . , 401n and the second edges 512a, 512b, . . . , 512n of the respective fifth heat exchangers 502a, 502b, . . . , 502n are in close proximity to each other and separated by a gap G as shown in FIG. 11. The fourth "A-Frame" heat exchangers 401a, 410b, . . . , 401n thus at least partially extend over the hot aisle 12 at angle $\theta_1$ to the horizontal. Similarly, the fifth "A-Frame" heat exchangers 502a, 502b, . . . , 502n thus at least partially extend over the hot aisle 12 at angle $\theta_2$ to the horizontal.

Figure 12:
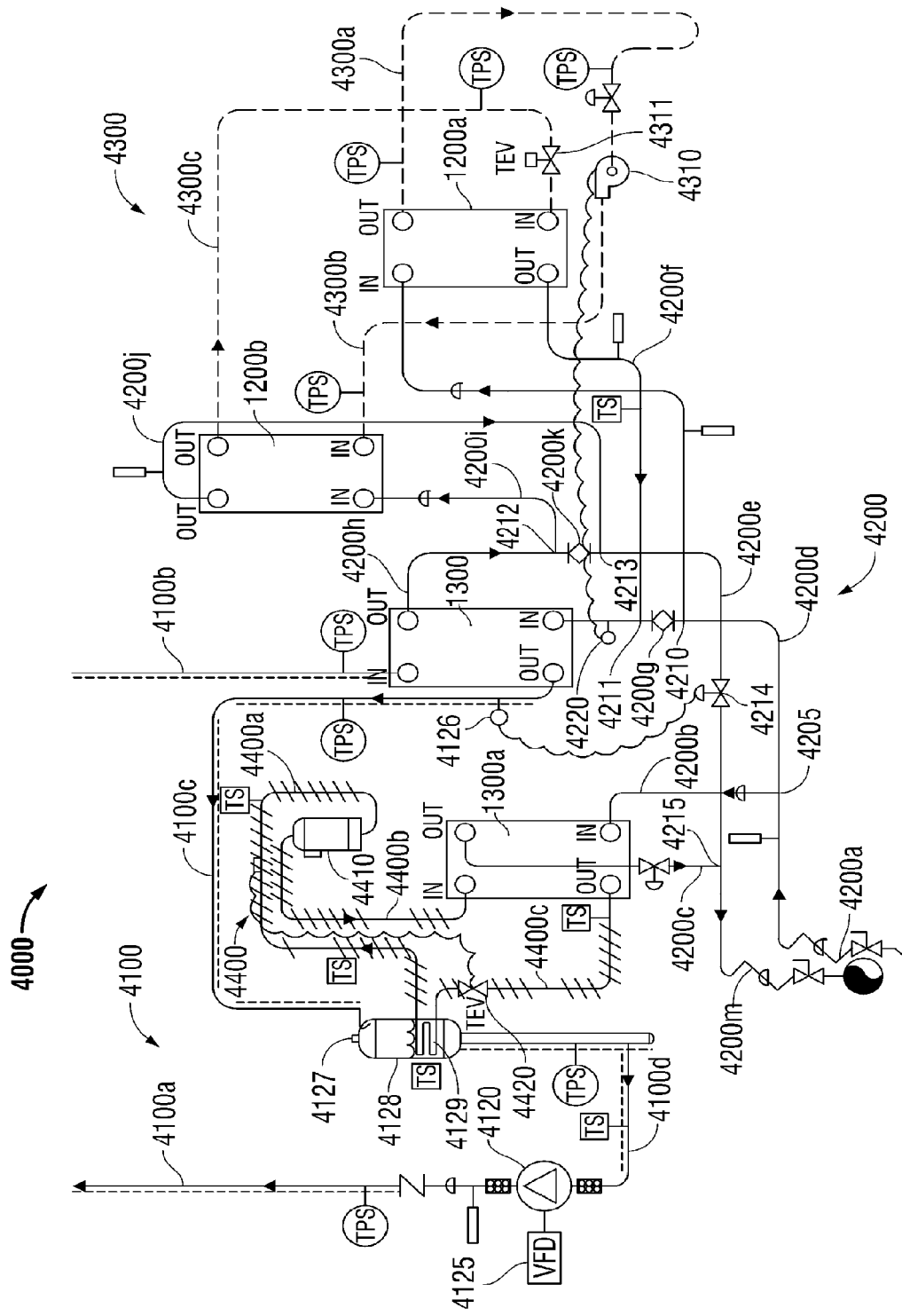
FIG. 12 is an exemplary embodiment of a flow diagram for a close-coupled cooling system for chillerless operation in high wet bulb temperature applications according to the present disclosure.

FIG. 12 illustrates a flow diagram of one embodiment of a close-coupled cooling system 4000 designed to cool electronic equipment of an IT data center such as the IT data assemblies 10 and 10' described above with respect to FIGS. 1-11. The system 4000 includes four independent, yet cooperating, fluid circuits designated as 4100, 4200, 4300, and 4400, respectively.

The first circuit 4100 interfaces with the electronic equipment of the IT data center and provides cooling to the electronic equipment via a first fluid. The first fluid may contain a liquid refrigerant R134a or similar refrigerants. The first circuit 4100 includes at least one evaporator coil (not shown in FIG. 12, but see, e.g., the evaporator coils of FIG. 16 and corresponding description) that is in thermal communication with the electronic equipment and extracts heat from the electronic equipment to the first fluid. As the first fluid flows from an inlet of the at least one evaporator coil to an outlet of the evaporator coil, heat is transferred from the electronic equipment to the first fluid. In one embodiment, the first fluid enters the at least one evaporator coil at a temperature of approximately 23° C. During heat transfer or exchange, the first fluid transforms from a liquid state to an at least partially vapor state.

The first circuit 4100 includes a fluid supply path 4100a and a fluid return path 4100b coupled to the inlet and outlet of the at least one evaporator coil, respectively. The fluid supply path 4100a delivers the first fluid in a liquid state to the inlet of the at least one evaporator coil, and the fluid return path 4100b receives the first fluid in an at least partially vapor state from the outlet of the at least one evaporator coil. The first circuit 4100 includes a liquid refrigerant pump 4120 that pumps the first fluid through the fluid supply path 4100a. The first circuit 4100 also includes a variable frequency drive 4125 that regulates capacity and motor speed of the liquid refrigerant pump 4120.

The first circuit 4100 further includes a main condenser 1300 that receives the first fluid from the fluid return path 4100b. The main condenser 1300 is a refrigerant-to-water heat exchanger that cools the first fluid that passes through the main condenser 1300 and condenses the first fluid from the at least partially vapor state to the liquid state. In one embodiment, to fully condense and cool the first fluid, the main condenser 1300 is maintained at a predetermined condensing temperature of approximately 23.3° C. or lower.

Further, the first circuit 4100 may include (1) a fluid path 4100c that carries the first fluid from the main condenser 1300 to a refrigerant liquid receiver 4128, and (2) a fluid path 4100d that carries the first fluid from the refrigerant liquid receiver 4128 to a suction side of the liquid refrigerant pump 4120.

The refrigerant liquid receiver 4128 is configured to detect and regulate the temperature of the first fluid. Specifically, the refrigerant liquid receiver 4128 is configured to reduce the temperature of the first fluid by thermally coupling the first circuit 4100 to the fourth circuit 4400. In some embodiments, the refrigerant liquid receiver 4128 maintains the first fluid at a predetermined temperature between approximately 22.2° C. and approximately 23.3° C.

The refrigerant liquid receiver 4128 may also include components (e.g., a detector and a controller) configured to detect and regulate the liquid level of the first fluid contained in the refrigerant liquid receiver 4128. A low liquid level in the refrigerant liquid receiver 4128 may cause cavitation problems at the liquid refrigerant pump 4120. To avoid this problem, the refrigerant liquid receiver 4128 includes a liquid level controller 4127 that detects the liquid level in the receiver 4128 and triggers an alarm if a low liquid level is detected. Also, the refrigerant liquid receiver 4128 may collect the first fluid in the first circuit 4100 when the cooling system 4000 is in an idle or standby mode.

The first circuit 4100 also includes a temperature sensor 4126 that is located on the fluid path 4100c at the exit of the main condenser 1300. The temperature sensor 4126 detects the temperature of the first fluid when it exits from the main condenser 1300. The readings of the temperature sensor 4126 reflect the temperature of the main condenser 1300.

The second circuit 4200 interfaces with the first circuit 4100 at the main condenser 1300a, where the second circuit 4200 performs heat exchange with the first circuit 4100. Specifically, the second circuit 4200 has a second fluid flowing through it. The second fluid removes heat from the first fluid of the first circuit 4100 at the main condenser 1300a. In one embodiment, upon exiting the main condenser 1300a, the second fluid has a temperature of approximately 22.8° C.

The second circuit 4200 includes a fluid path 4200a that carries the second fluid from a cooling tower, fluid cooler, or dry cooler (not shown in FIG. 12) to the second circuit 4200. The fluid path 4200a is fluidly coupled to a fluid path 4200d which delivers the second fluid to the main condenser 1300. The second circuit further includes a fluid path 4200h that receives the second fluid from the main condenser 1300. The fluid path 4200h is fluidly coupled to a fluid path 4200e which carries the second fluid to a fluid path 4200m that delivers the second fluid back to the cooling tower, fluid cooler or dry cooler.

In some embodiments, the second circuit 4200 includes a pump to facilitate the flow of the second fluid through the second circuit 4200. In one embodiment, the second fluid is regulated at a flow rate of approximately 1192 liters/minute. The pump may be in any of the following forms: a central pumping and cooling tower, dry cooler, fluid cooler or other chilled, well water circuit, or other chilled water circuit.

Further, the second circuit 4200 may include a mixed water temperature sensor 4220 that monitors the temperature of the second fluid before it enters the main condenser 1300. The second circuit 4200 may also include a water regulating valve 4214, which operatively communicates with the temperature sensor 4126 of the first circuit 4100. The water regulating valve 4214 is configured to regulate the flow rate of the second fluid in proportion to the readings of the temperature sensor 4126.

For instance, to maintain the main condenser 1300 at or below a predetermined condensing temperature (e.g., 23.3° C.), the water regulating valve 4214 adjusts the flow rate of the second fluid based on the temperature of the main condenser 1300 as measured by the temperature sensor 4126. For example, if the temperature sensor 4126 has a reading significantly higher than the predetermined condensing temperature (e.g., 23.3° C.) of the main condenser 1300, the water regulating valve 4214 then significantly increases the flow rate of the second fluid flowing through the second circuit 4200 to thereby rapidly reduce the temperature of the main condenser 1300. However, if the temperature sensor 4126 has a reading slightly higher than the predetermined condensing temperature (e.g., 23.3° C.), the water regulating valve 4214 then slightly increases the flow rate of the second fluid flowing through the second circuit 4200.

In some embodiments, to maintain the temperature of the main condenser 1300 at or below the predetermined condensing temperature (e.g., 23.3° C.), the second fluid is maintained at a threshold temperature of approximately 18.9° C. or lower.

To maintain the second fluid at or below the threshold temperature (e.g., 18.9° C.), the second circuit 4200 may include at least one cooling mode to cool the second fluid. For example, the second circuit 4200 may include a simple free cooling mode in which the second circuit 4200 relies on the atmosphere to cool the second fluid via a cooling tower, fluid cooler, or dry cooler (not shown in FIG. 12). In operation, after heat is transferred from the first fluid to the second fluid at the main condenser 1300, the second fluid follows the fluid paths 4200h, 4200e and proceeds to a cooling tower, fluid cooler or dry cooler (not shown in FIG. 12) to reject its heat into the atmosphere. The cooled second fluid then follows the fluid paths 4200a and 4200d back to the main condenser 1300 to cool the first fluid. It is envisioned that the second fluid may continuously repeat the above cycle.

In one embodiment, the simple free cooling mode maintains the second fluid at or below the threshold temperature (e.g., 18.9° C.), only when the wet bulb temperature of the IT data center is below 17.2° C. If the wet bulb temperature is above 17.2° C., the second fluid may exceed its threshold temperature.

Further, the second circuit 4200 may include a mechanical compressed cooling mode, in which the third circuit 4300 cools the second circuit 4200 through mechanical compression cycles. A third fluid flows through the third circuit 4300. The third fluid may contain a liquid refrigerant, such as R134a, or any other suitable refrigerant.

The third circuit 4300 includes an atmospheric sub-cooler exchanger 1200a to sub-cool the second fluid 4200 before the second fluid arrives at the main condenser 1300. The atmospheric sub-cooler exchanger 1200a is a refrigerant-to-water heat exchanger that trims or cools at least a portion of the second fluid. The third circuit 4300 may also include a trim condenser 1200b, which is a refrigerant-to-water heat exchanger that transfers heat in the third fluid, which is the heat that the third fluid has absorbed from the second fluid at the atmospheric sub-cooler exchanger 1200a, back to the second fluid. The third circuit 4300 may further include a sub-cooler compressor 4310 that compresses the third fluid.

The third circuit 4300 includes a fluid path 4300a that carries the third fluid from the atmospheric sub-cooler exchanger 1200a to the sub-cooler compressor 4310 for compression, and a fluid path 4300b that carries the compressed third fluid to the trim condenser 1200b. Additionally, the third circuit 4300 includes a fluid path 4300c that carries the third fluid from the trim condenser 1200b to a metering device, or a thermal expansion valve 4311, which expands the third fluid back to the atmospheric sub-cooler exchanger 1200a. It is envisioned that the third fluid may continuously flow through the third circuit 4300 as long as the third circuit 4300 is activated.

In some embodiments, the third circuit 4300 is activated only when the second fluid exceeds its threshold temperature (e.g., 18.9° C.), which may occur when the wet bulb temperature is over 17.2° C. The cooling capacity of the third circuit 4300 may be regulated in direct proportion to the wet bulb temperature that is in excess of 17.2° C., as illustrated in Table 1 below.

TABLE 1

| WET BULB TEMPERATURE | COOLING CAPACITY OF THE THIRD CIRCUIT 4300 |
|---|---|
| 63 wb (17.2° C.) | 0 kW |
| 64 wb (17.8° C.) | 45.7 kW |
| 65 wb (18.3° C.) | 91.4 kW |
| 66 wb (18.9° C.) | 137.2 kW |
| 67 wb (19.4° C.) | 182.9 kW |
| 68 wb (20° C.) | 228.6 kW |
| 69 wb (20.6° C.) | 274.3 kW |
| 70 wb (21.1° C.) | 320 kW |

The third circuit 4300 closely controls the temperature of the second fluid by trimming and cooling the temperature of the second fluid one degree at a time. For instance, if the second fluid temperature rises above its threshold temperature by one degree, the third circuit 4300 then reduces the temperature of the second fluid by one degree.

In one embodiment, for efficiency reasons, the second circuit 4200 directs a small portion of the second fluid to perform heat exchange with the third fluid, before the second fluid enters the main condenser 1300. Specifically, the second circuit 4200 includes a splitter tee 4210 on the fluid path 4200d before an inlet of the main condenser 1300. The splitter tee 4210 diverts a portion of the second fluid, e.g., approximately one third of the second fluid, to an inlet of the atmospheric sub-cooler exchanger 1200a. In some embodiments, the portion of the second fluid has a temperature of 22.2° C. at the inlet of the atmospheric sub-cooler exchanger 1200a.

The second circuit 4200 may include another splitter tee 4211 on the fluid path 4200d upstream from the splitter tee 4210. In conjunction with a flow balancing or flow control valve 4200g positioned in fluid path 4200d between splitter tee 4210 and splitter tee 4211, the splitter tee 4211 allows the portion of the second fluid to flow from an outlet of the atmospheric sub-cooler exchanger 1200a back to the fluid path 4200d. At the splitter tee 4211, the portion of the second fluid, e.g., approximately one third of the second fluid, rejoins the remaining portion of the second fluid, e.g., approximately two thirds of the second fluid. The blended second fluid then proceeds to the main condenser 1300. It is envisioned that the blended second fluid has a temperature of approximately 18.9° C. before entering the main condenser 1300.

Alternatively, depending upon the degree or percentage opening of the flow control or flow balancing valve 4200g, flow control or flow balancing valve 4200g can allow either complete or partial divergence of flow from the main condenser 1300 to the atmospheric sub-cooler exchanger 1200a or force flow in fluid path 4200d entirely through main condenser 1300.

Additionally, for efficiency reasons, the second circuit 4200 may direct only a small portion of the second fluid to perform heat exchange with the third fluid, after the second fluid exits from the main condenser 1300. Specifically, the second circuit 4200 includes a splitter tee 4212 on the fluid path 4200h at the exit of the main condenser 1300. The splitter tee 4212 diverts a portion of the second fluid, e.g., approximately one third of the second fluid via a fluid path 4200i to the trim condenser 1200b to reclaim heat from the third fluid. In some embodiments, the approximately one third of the second fluid has a temperature of approximately 27.4° C. at an outlet of the trim condenser 1200b. The second circuit 4200 may include an additional splitter tee 4213 on the fluid path 4200h downstream from the splitter tee 4212. In conjunction with a flow balancing or flow control valve 4200k positioned in fluid path 4200e between splitter tee 4212 and splitter tee 4213, the splitter tee 4213 allows the portion of the second fluid, e.g., approximately one third of the second fluid exiting from the trim condenser 1200b to join the rest of the second fluid. At the splitter tee 4213, the portion of the second fluid, e.g., approximately one third of the second fluid rejoins the remaining portion of the second fluid, e.g., approximately two thirds of the second fluid. In some embodiments, the blended second fluid has a temperature of approximately 26.4° C. at the splitter tee 4213. The blended second fluid then together follows the fluid paths 4200e, 4200m towards the exit of the second circuit 4200.

Alternatively, depending upon the degree or percentage opening of the flow balancing or flow control valve 4200k, flow balancing or flow control valve 4200k can allow either partial or complete divergence of flow from the main condenser 1300 to the trim condenser 1200b or force flow in fluid paths 4200h and 4200e entirely through main condenser 1300.

In some embodiments, the third circuit 4300 does not include the atmospheric sub-cooler exchanger 1200a or the trim condenser 1200b. Rather, the third circuit 4300 includes a trim chiller which is configured to cool the entire IT data center.

In one embodiment, the second circuit 4200 may exclusively have only one cooling mode, either the simple free cooling mode or the mechanical compressed cooling mode described above.

In another embodiment, the second circuit 4200 may have both of the cooling modes that alternate with each other. For instance, the second circuit 4200 switches to the simple free cooling mode when the wet bulb temperature is at or below a threshold temperature, e.g., 17.2° C., and switches to the mechanical compressed cooling mode once the wet bulb temperature exceeds the threshold temperature.

In other embodiments, the two cooling modes cooperate with other, and the second circuit 4200 may operate in both cooling modes concurrently. In these embodiments, the simple free cooling mode is always on, such that the simple free cooling mode remains active regardless of the wet bulb temperature. On the other hand, the mechanical compressed cooling mode, e.g., the third circuit 4300, is activated only when the simple free cooling mode alone cannot maintain the second fluid at or below the threshold temperature, e.g., 18.9° C., such as when the wet bulb temperature is above the threshold temperature, e.g., 17.2° C. In these embodiments, when the wet bulb temperature is at or below its threshold temperature, the second circuit 4200 relies solely on the atmosphere for cooling. Once the wet bulb temperature reaches beyond its threshold temperature, the third circuit 4300 is activated and is controlled to generate cooling capacity in proportion to the wet bulb temperature that is in excess of the threshold temperature. It is envisioned that the third circuit 4300 can be turned on and off automatically without user intervention. For instance, the atmospheric sub-cooler exchanger 1200a automatically becomes active or inactive as the wet bulb temperature crosses its threshold temperature.

Statistically, the cooling system 4000 operates exclusively in the simple free cooling mode for approximately 95% of the operating time. The mechanical compressed cooling mode is turned on for approximately 5% of the operating time. In a geographical area where the wet bulb temperature is about 18.3° C., the cooling system 4000 may run exclusively in the simple free cooling mode virtually all year round and turns on the mechanical compressed cooling mode for less than 0.04% of the operating time. If the area has a wet bulb temperature of about 20.6° C., the mechanical compressed cooling mode is active for about 3% of the operating time. In all these scenarios, a traditional, large, oversized cooling electrical infrastructure as in the prior art would rely on mechanical compression cycles for about 40-60% of its operating time, thus inducing a much higher operation cost than that of the cooling system 4000.

In addition to the second circuit 4200, the fourth circuit 4400 may also perform heat exchange with the first circuit 4100. Specifically, the fourth circuit 4400 interfaces with the first circuit 4100 at the refrigerant liquid receiver 4128 where the fourth circuit 4400 condenses and cools the first fluid via a fourth fluid that flows through the fourth circuit 4400. The refrigerant liquid receiver 4128 has a sub-cooler coil 4129, which is an evaporator thermally coupled to both the first circuit 4100 and the fourth circuit 4400.

The fourth circuit 4400 includes a sub-cooler compressor 4410 configured to compress the fourth fluid and a sub-cooler condenser 1300a which transfers heat from the fourth circuit 4400 to the second circuit 4200. Both the sub-cooler compressor 4410 and the sub-cooler condenser 1300a are fluidly coupled to the sub-cooler coil 4129 of the refrigerant liquid receiver 4128.

The fourth circuit 4400 includes a fluid path 4400a that carries the fourth fluid from the receiver sub-cooler coil 4129 to a suction side of the sub-cooler compressor 4410 for compression, a fluid path 4400b that carries the compressed fourth fluid from the sub-cooler compressor 4410 to the sub-cooler condenser 1300a, and a fluid path 4400c that carries the fourth fluid from the sub-cooler condenser 1300a to a thermal expansion valve 4420, which expands the fourth fluid and provides the expanded fourth fluid to the sub-cooler coil 4129.

In some embodiments, the fourth circuit 4400 is automatically turned on and off based on the conditions detected by the refrigerant liquid receiver 4128. For instance, the fourth circuit 4400 becomes active when the liquid level detected by the refrigerant liquid receiver 4128 drops below a predetermined threshold. Specifically, the fourth circuit 4400 may be activated in response to an alarm signal generated by the liquid level controller 4127 when a low liquid level is detected, and may become inactive when the liquid level reaches the predetermined threshold. Further, the fourth circuit 4400 may also controlled based on the temperature of the first fluid as detected by the refrigerant liquid receiver 4128. For instance, the fourth circuit 4400 may become active when the temperature of the first fluid exceeds a predetermined threshold, and become inactive when the temperature drops to or below the predetermined threshold.

The second circuit 4200 removes heat from the fourth circuit 4400 at the sub-cooler condenser 1300*a*. In some embodiments, the second circuit 4200 includes a splitter tee 4205 on the fluid path 4200*d*. The splitter tee 4205 includes a split path 4200*b* that diverts a small portion of the second fluid, e.g., approximately 19 liters/minute, to an inlet of the sub-cooler condenser 1300*a* where the small portion of the second fluid extracts heat from the fourth circuit 4400. The remaining, undiverted portion of the second fluid follows the fluid path 4200*d* to the main condenser 1300 to remove heat from the first circuit 4100.

The second circuit 4200 may also include another splitter tee 4215 on the fluid path 4200*e*. The splitter tee 4215 has a split branch 4200*c* that carries the small portion of the second fluid returned from an outlet of the sub-cooler condenser 1300*a* to the fluid path 4200*e* to join the rest of the second fluid proceeding towards the exit of the second circuit 4200. In one embodiment, the temperature of the second fluid at the splitter tee 4215 is approximately 26.4° C. when the fourth circuit 4400 is active, i.e., when the sub-cooler condenser 1300*a* is turned on, and approximately 26.7° C. when the fourth circuit 4400 is inactive, i.e., when the sub-cooler condenser 1300*a* is turned off.

The close-coupled cooling system 4000 may be installed in an auxiliary enclosure of a modular data pod (see FIGS. 13-17 and related discussion below) and may provide chillerless cooling within a data enclosure of the modular data pod in high wet bulb temperature applications.

The operation of the close-coupled cooling system 4000 may be summarized as follows. In the free cooling mode of operation, the first cooling circuit 4100 which includes the liquid receiver 4128 and the liquid refrigerant pump 4120 and the second cooling circuit 4200 which includes the main condenser 1300 are in operation to transfer heat from the data center assemblies 10 or 10' described above via the fluid supply path 4100*a* and fluid return path 4100*b* and to reject heat to the environment via the low temperature supply path 4200*a* and via primary cooling coil cooling water return connection 4200*m*.

When the environmental conditions preclude exclusive reliance on the free-cooling mode of operation, e.g., if the wet-bulb temperature is at or exceeds a predetermined wet-bulb temperature limit, or if there is an increase in the heat load generated within the data center assemblies 10 or 10', the close-coupled cooling system 4000 is placed into an incremental mechanical-assist cooling mode of operation. In the incremental mechanical assist cooling mode of operation, first cooling circuit 4100 and the second cooling circuit 4200 as described above with respect to the free cooling mode of operation continue to remain in operation while the third cooling circuit 4300, which includes the trim condenser 1200*b*, the sub-cooler exchanger 1200*a*, and the sub-cooler compressor 4310, is placed into operation to permit incremental additional cooling of the data center assemblies 10 or 10' such that the cooling capacities of the first, second and third cooling circuits 4100, 4200 and 4300, respectively, are adjusted incrementally depending on the on the change in heat load from the data center assemblies 10 or 10' and/or any change in environmental conditions based on the wet bulb temperature.

In an alternative incremental mechanical-assist cooling mode of operation, the first cooling circuit 4100 and the second cooling circuit 4200 as described above with respect to the free-cooling mode of operation continue to remain in operation while the fourth cooling circuit 4400, which includes the sub-cooler condenser 1300*a* and the sub-cooler compressor 4410, is placed into operation to permit incremental additional cooling of the data center assemblies 10 or 10' such that the cooling capacities of the first, second and fourth cooling circuits 4100, 4200 and 4400, respectively, are adjusted incrementally depending on the on the increase or decrease in heat load from the data center assemblies 10 or 10' and/or any change in environmental conditions based on the wet bulb temperature.

When the environmental conditions and/or the heat load from the data center assemblies 10 or 10' preclude exclusive reliance on the free-cooling mode of operation together with either one of the incremental mechanical assist modes of operation, the close-coupled cooling system 4000 is placed into a supplemental incremental mechanical assist-mode of operation. In the supplemental incremental mechanical assist mode of operation, the first cooling circuit 4100, the second cooling circuit 4200 and the third cooling circuit 4300 as described above with respect to the incremental mechanical-assist mode of operation continue to remain in operation while the fourth cooling circuit 4400 is placed into operation to permit incremental additional cooling of the data center assemblies 10 or 10' such that the cooling capacities of the first, second, third and fourth cooling circuits 4100, 4200, 4300 and 4400, respectively, are adjusted incrementally depending on the on the increase or decrease in heat load from the data center assemblies 10 or 10' and/or any increase in environmental conditions based on the wet bulb temperature.

The cooling system 4000 has many significant advantages over traditional cooling systems, such as chilled water systems, chiller plants or direct expansion cooling systems. First, the cooling system 4000 requires far less mechanical-assisted cooling infrastructure than traditional cooling systems. The cooling system 4000 increases its use of mechanical-assisted cooling infrastructure only when necessary. Specifically, the cooling system 4000 has two basic circuits, i.e., the first circuit 4100 and the second circuit 4200, which run constantly, and two backup circuits, i.e., the third circuit 4300 and the fourth circuit 4400, which run only when necessary. Specifically, the third circuit 4300 is active only when the wet bulb temperature is above the threshold temperature, and the fourth circuit 4400 is active only when the first fluid liquid level is low or the first fluid temperature is above a certain threshold. Since the two backup circuits operate only when necessary, e.g., approximately 10-20% of the operating time, the cooling system 4000 overall relies on less mechanical-assisted cooling infrastructure than the traditional cooling system.

Second, the cooling system 4000 is less prone to failures than the traditional cooling system. Specifically, the cooling system 4000 completely avoids a full system swing over process that is common in the traditional cooling system. A full system swing over process switches between two systems by shutting down one system and starting up another, which typically happens when the traditional cooling system switches between a free cooling system and a mechanical cooling system. The full system swing over process is dangerous and prone to failures. The cooling system 4000, on the other hand, avoids the full system over process. In the cooling system 4000, the basic circuits and the backup circuits run independently, yet cooperating with each other. The basic circuits 4100 and 4200 run continuously regardless of the state of the backup circuits 4300 and 4400. The backup circuits 4300 and 4400 are turned on only when necessary. Accordingly, the cooling system 4000 avoids the failures in the full system swing over process, and is a safer approach than the traditional cooling system.

Third, the cooling system 4000 has a higher tolerance for high wet bulb temperatures than the traditional cooling system. The traditional cooling system generally has a very high operation cost when the wet-bulb temperature is above 10° C. For instance, the maximum wet-bulb temperature that the traditional cooling system can survive in a free-cooling mode is approximately 10° C. When the wet-bulb temperature exceeds 10° C., the traditional cooling system must switch from a free-cooling system to a mechanical cooling system to provide sufficient cooling to an IT data center. For about every half degree above 10° C., the mechanical cooling system has to generate an additional cooling capacity of 320.6 kW, which demands the traditional cooling system to acquire sufficient power to generate the additional cooling capacity.

On the other hand, the cooling system 4000 of the present disclosure has a better tolerance for high wet-bulb temperatures. In some embodiments, the maximum wet bulb temperature that the cooling system 4000 can survive in a free cooling mode is approximately 17.2° C., much higher than that of the traditional cooling system. Once the wet-bulb temperature exceeds 17.2° C., the cooling system 4000 switches to the mechanical compressed cooling mode. For every half degree above 17.2° C., the mechanical compressed cooling mode generates an additional cooling capacity of 45.7 kW, which, in turn, consumes significantly less power than the traditional cooling system. Because of its high tolerance for high wet bulb temperature, the cooling system 4000 is better suited for a high density IT data center, e.g., 40 kW per rack, than the traditional cooling system.

Fourth, the cooling system 4000 is more energy efficient than the traditional cooling system. The cooling system 4000 maximizes energy savings by having the simple free cooling mode which relies on atmosphere to assist cooling the IT data center. In the simple free cooling mode, the cooling system 4000 consumes a limited of power, which, for instance, is 15% less than what is required to power the traditional cooling system. Further, the cooling system 4000 adjusts its power consumption dynamically as a function of the load in the IT data center. As the load increases, the cooling system 4000 increases its power consumption level to cause an increase in the flow rates in the two basic circuits and/or activate one or both of the backup circuits, which, in turn, generate more cooling capacity to compensate for the load increase. By contrast, as the load decreases, the cooling system 4000 decreases its power consumption level which, in turn, reduces its output of cooling capacity.

Fifth, the cooling system 4000 is more scalable to the size of the IT data center and easier deployable than the typical cooling system. For instance, the cooling system 4000 can be deployed modularly at specific, targeted locations in an IT data center, in contrast to the typical cooling system which has to be deployed as a whole covering the full extent of the IT data center. Due to its modularity, the cooling system 4000 targets specific locations in the IT data center and avoids locations that do not need cooling. Also due to its modularity, the cooling system 4000 can be deployed on existing and retrofit cooling systems which the typical cooling system fails to do. Further, the number of cooling systems 4000 deployed in an IT data center may be scaled according to the dynamic change, e.g., shrink or growth, of the IT data center.

Lastly, the cooling system 4000 has a lower overall cost than that of the traditional cooling system. For instance, the cooling system 4000 requires a relatively low initial capital and maintenance. Further, due to its energy efficiency, the cooling system 4000 has a low operation cost. As a result, the cooling system 4000 is more cost effective than the traditional cooling system. Because of its overall low cost, in addition to its high tolerance for high wet bulb temperature, the cooling system 4000 is an optimal cooling choice for the high density IT data center, e.g., 40 kW per rack.

Thus, a control strategy is employed to enable close system pressure and flow tolerances utilizing bypass control valves, temperature and pressure sensors, and receiver safeties and pressure regulators. This control strategy may be executed in real time and is relational with dynamic control of all components. The control strategy incorporates feed back from the IT servers, in order to better facilitate close coupled cooling based on real time individual loading of the rack servers and computer loads.

One of the benefits of the dedicated close-coupled cooling systems (e.g., 525) is that they can adapt to the different heat loads that are generated by different servers contained in the modular data pods. As a result, the dedicated close-coupled cooling systems can operate efficiently. In contrast, traditional cooling systems for data centers and data pod modules are typically designed for, and operate at, the worst case conditions for a particular computer design. Also, traditional cooling systems cool all data pod modules according to the data module with the greatest heat load.

FIGS. 13-17 illustrate a modular data pod 80" that includes an "A-Frame" cooling circuit 2601. In one embodiment, the "A-Frame" cooling circuit 2601 contains a coolant supplied from a first cooling cycle skid 3001 as discussed above with respect to FIGS. 6 and 7. For the specific application of the modular data pod 80" illustrated in FIGS. 13-15 "A-Frame The "A-Frame" cooling circuit 2601 has an "A-Frame" heat exchanger assembly 3400, which is formed partially of cooling coils 3401*a-c* and 3502*a-c*, illustrated in FIG. 14, in conjunction with an air circulator support structure 816 illustrated in FIG. 13.

Figure 13:
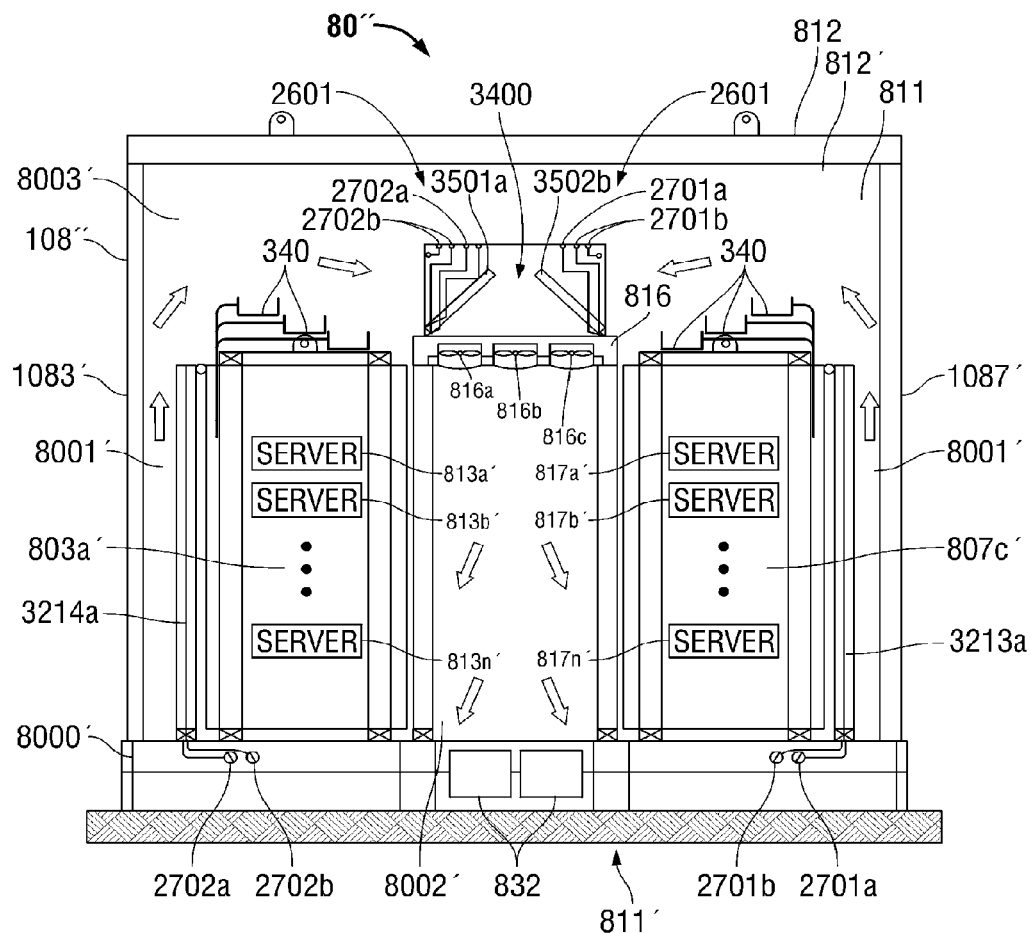
FIG. 13 illustrates a modular data pod that includes a separate cooling circuit that forms an "A-Frame" heat exchanger assembly according to one embodiment of the present disclosure.

With reference to FIG. 13, the air circulator support structure 816 includes air circulators 816*a*, 816*b* and 816*c* that are configured and disposed in a manner to induce air circulation in the following direction. Cold air in the cold aisle 8002' flows downwardly from the top of each server rack 803*a*' or 807*c*' to the bottom of the server rack. After the air passes through a server, e.g., 813*a*' on a server rack, e.g. 803*a*', the air passes across a heat exchanger 3214*a*, and then enters a hot aisle 8001' located between the server rack, e.g. 803*a*', and an external wall member 1083'. Subsequently, the air circulates upwardly into a third volume 8003' to complete one circulation cycle. The air then recirculates through the "A-Frame" heat exchanger assembly 3400 in the same order described above.

The modular data pod 80" is supported on a support structure 8000' which includes fluid supply paths 2701*a* and 2702*a* which is part of the first fluid circuit 2071 and fluid return paths 2702*a* and 2702*b* which is part of the second fluid circuit 2702 as explained below with respect to FIGS. 16 and 17.

The modular data pod 80" also includes cable trays 340 that are exemplarily mounted above the server racks, e.g., 803*a*' and 807*c*'. In one embodiment, the modular data pod 80" includes a dedicated electrical power supply, e.g. one or more batteries 832 located at a lower end 811' of the data pod enclosure 108".

External wall members 1083' and 1087' define an aperture 812' at an upper end 811 of data enclosure 108". A data pod covering member 812 is configured and disposed in a manner to substantially cover the aperture 812'.

Figure 14:
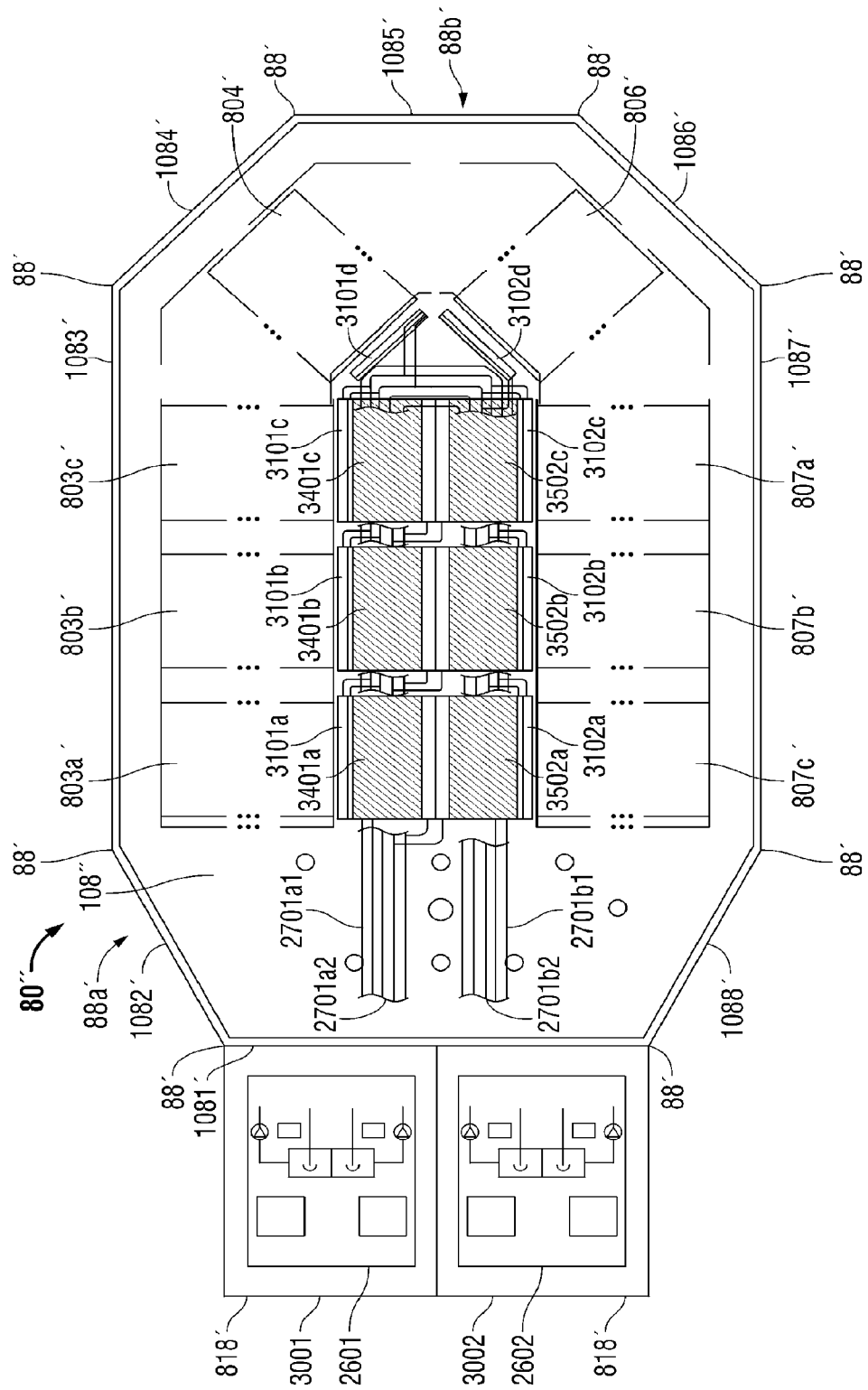
FIG. 14 is an upper plan view of the modular data pod of FIG. 13 that includes the separate cooling circuit that forms an "A-Frame" heat exchanger assembly according to one embodiment of the present disclosure.

FIG. 14 is an upper plan view of the modular data center pod 80" assembly having a server rack cooling structure disposed within the cold aisle above the space defined by a plurality of server racks arranged in a "U"-shape according to other embodiments of the present disclosure. More particularly, modular octagonal data pod 80" includes a data enclosure 108" including eight external wall members 1081', 1082', 1083', 1084', 1085', 1086', 1087' and 1088' that are contiguously joined to one another along at least one edge 88' in the shape of a polygon.

Contiguous external wall members 1088', 1081' and 1082' form a first end 88a' of the modular data pod 80' while correspondingly contiguous external wall members 1084', 1085' and 1086' form a second end 88b' of the modular data pod 80'.

Elongated external wall member 1083' includes server racks 803a'-c', and the second end 88'b includes two server racks 804' and 806'. Elongated external wall member 1087' includes server racks 807a'-c'.

The server racks may be arranged in a "U"-shape as illustrated in FIG. 14, or other shapes as described in commonly assigned PCT/US2011/41710 by Keisling et al. entitled "SPACE-SAVING HIGH DENSITY MODULAR DATA PODS AND ENERGY-EFFICIENT COOLING SYSTEM", filed on Jun. 23, 2011, incorporated by reference herein, as described above.

Modular data pod 80" also includes first heat exchangers 3101a-d mounted above server racks 803a', 803b', 803c' and 804', respectively. Modular data pod 80" also includes second heat exchangers 3102a-d mounted above server racks 807c', 807b', 807a' and 806', respectively.

Modular data pod 80" also includes an auxiliary enclosure 818' adjacent to one of the external wall members 1081' to 1088', with the auxiliary enclosure 818' illustrated as being adjacent to external wall member 1081'. Similarly, the auxiliary enclosure 818' includes one or more close-coupled dedicated cooling systems 2601 and 2602 for chillerless operation in high wet bulb temperature applications which is further described in detail below with respect to FIG. 17.

Figure 15:
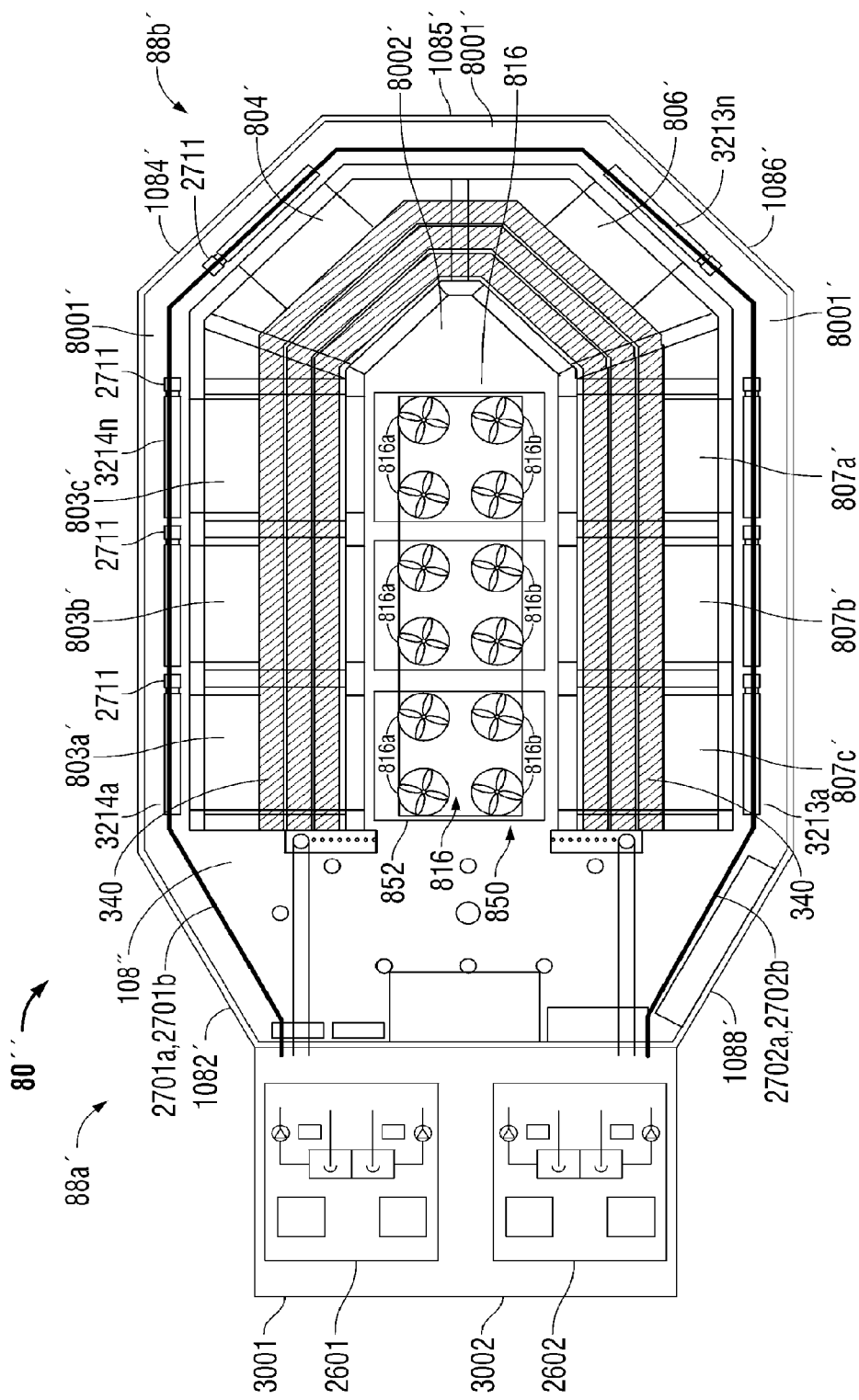
FIG. 15 is a lower plan view of the modular data center pod assembly of FIG. 14 illustrating forced-flow cooling devices that force air vertically through a sump below the central aisle of the modular data center pod assembly.

FIG. 15 is a lower plan view of the modular data center pod 80" assembly of FIG. 14 illustrating forced-flow cooling devices that force air vertically through a sump below the central aisle of the modular data center pod assembly. More particularly, air circulators 816a and 816b are disposed below central aisle 850 of the modular data center pod 80" and are configured to force air flow vertically upwards through a sump 852. The cable trays 340 exhibit a generally "U-shaped" configuration above the server racks 803a'-c', 804', 806' and 807a'-c'.

Figure 16:
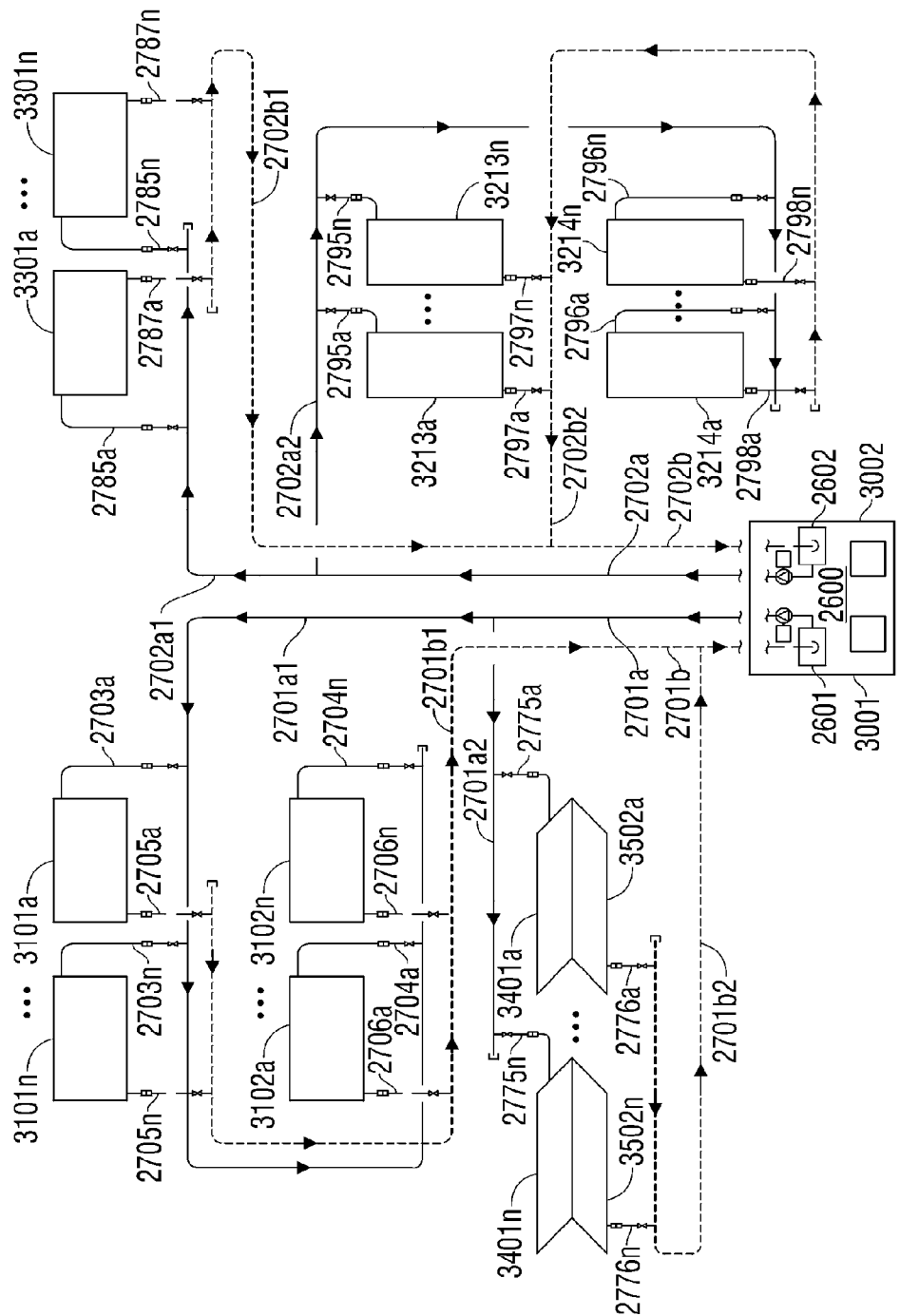
FIG. 16 is a schematic flow diagram of a cooling system for a data center assembly including the close-coupled cooling system of FIG. 12 according to embodiments of the present disclosure.
Figure 17:
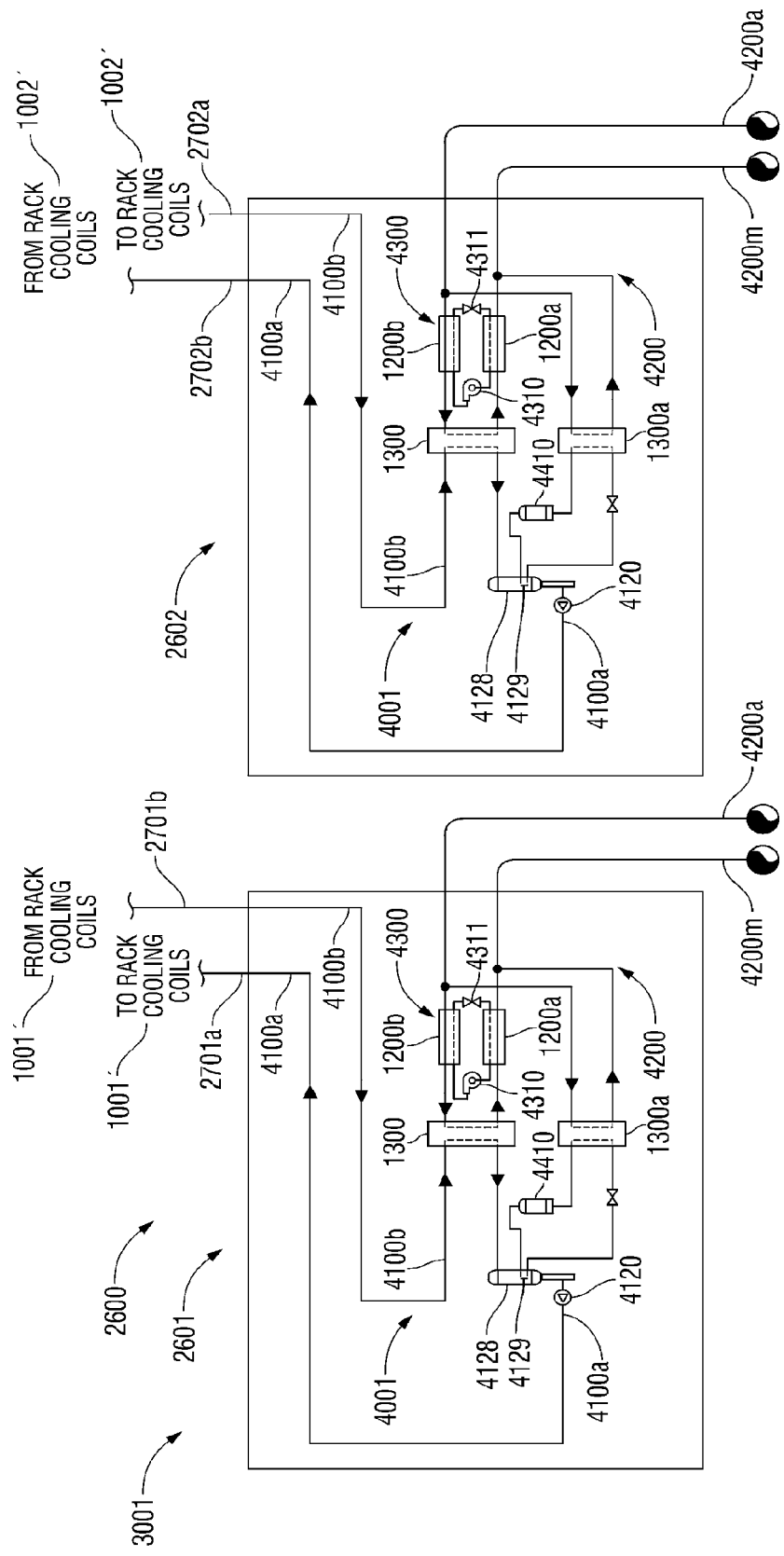
FIG. 17 is an enlarged view of cooling cycle skids that are illustrated as part of the modular data pod assembly of FIGS. 14-16.

In one embodiment, as illustrated in FIGS. 16-17, the modular data center pod 80" may include two "A-Frame" cooling circuits 2601, 2602. For clarity, odd-numbered reference numerals refer to components included in the first cooling circuit 2601 and even-numbered reference numerals refer to components included in the second cooling circuit 2602. Installation and operation of the cooling circuits 2601 and 2602 need not take place concurrently.

The two cooling circuits 2601, 2602 receive coolants supplied from a first cooling cycle skid 3001 and a second cooling cycle skid 3002, respectively.

As shown in FIG. 17, each cooling circuit 2601, 2602 includes a first fluid circuit 2701, 2702, respectively. The first fluid circuits 2701 and 2702 are evaporator circuits that utilize R134a or a similar refrigerant and, in one embodiment, are in thermal fluidic communication with the various heat exchangers of the data center assembly 10 or 10'.

Returning to FIG. 16, each of the first fluid circuits 2701, 2702 includes a fluid supply path 2701a, 2702a and a fluid return path 2701b, 2702b, both of which are in fluid communication with heat exchangers, e.g. 3101a-n, by carrying fluid or refrigerant to and from the heat exchangers. The heat exchangers, e.g., 3101a-n, are placed in close proximity to IT servers or IT racks in the IT data center for providing close coupled cooling at the point of load.

The first fluid supply path 2701a includes a first branch path 2702a1 which carries coolant or cooling fluid to the first heat exchangers 3101a-n via sub branches 2703a-n and to the second heat exchangers 3102a-n via sub branches 2704a-n. The first fluid return path 2701b carries coolant from the first heat exchangers 3101a-n via sub branches 2705a-n back to the first cooling circuit 2601, and carries coolant from the second heat exchangers 3102a-n via sub branches 2706a-n.

In one embodiment, the first fluid supply path 2701a includes a second branch path 2702a2 that supplies coolant to fourth heat exchangers 3401a-n via sub branches 2775a-n, and then to fifth heat exchangers 3502a-n. The coolant exits the fifth heat exchangers 3502a-n via sub branches 2776a-n to the first fluid return path 2701b via a branch path 2701b2. The coolant removes heat from the fourth and fifth heat exchangers and is converted to a heated fluid as a result.

It is envisioned that the second fluid paths 2702a-b have similar structures and functionalities as that of the first fluid paths 2701a-b to cool heat exchangers 3301a-n, 3213a-n and 3214a-n. (Heat exchangers 3301a-n are not illustrated in FIG. 16 but, in one embodiment, may be installed horizontally at the base of the "A-Frame" above or below and parallel to the air circulators 816a, 816b, 816c).

As the coolant leaves each heat exchanger, the coolant absorbs heat from the heat exchanger and becomes heated fluid, which is then delivered to the inlet of the main condenser 1300 illustrated in FIG. 12 for cooling.

As shown in FIG. 17, the first cooling circuit 2601 includes a cooling system similar to the cooling system 4000 of FIG. 12. The first fluid supply path 2701a and the first fluid return path 2701b of the first cooling circuit 2601 are respectively coupled to the first supply path 4100a and the first return path 4100b of the first circuit 4100 of the cooling systems 4001 and 4002, which in turn are in fluid communication with the first row 1001' and the second row 1002' of server racks as described above and illustrated in FIGS. 1 and 6-11 with respect to data assemblies 10 and 10' and to modular data pod 80" as described above and illustrated in FIGS. 14-16. In operation, the first fluid return path 2701b carries the heated fluid to the first return path 4100b, which delivers the heated fluid to the main condenser 1300 where the heated fluid is cooled and condensed. For purposes of cooling the heated fluid, the main condenser 1300 may be assisted by the second circuit 4200 and the third circuit 4300.

After the fluid exits from the main condenser 1300, the fluid flows to the refrigerant liquid receiver 4128 where the liquid level and temperature of the fluid is measured. If the liquid level is low or if the temperature is high, the sub cooler compressor 4410 and the sub cooler condenser 1300a are activated to increase the liquid level and/or reduce the temperature of the fluid. After the fluid exits from the refrigerant liquid receiver 4128, the fluid flows to the liquid refrigerant pump 4120 which pumps the fluid, now the coolant, to the fluid supply path 4100*a* which then delivers the coolant to the first fluid supply path 2701*a*. The coolant would then be reused to cool the heat exchangers, e.g., heat exchangers 3101*a-n*.

Having now received the benefit of the description of cooling system 4000 described above with respect to FIG. 12, those skilled in the art will recognize that cooling systems 4001 and 4002 are simplified versions of cooling system 4000.

For extremely high density applications (e.g., greater than 25 kW per rack), a dual coil (in series) circuit can be utilized. The secondary coil (e.g., a micro channel) receives the coldest refrigerant liquid first. This coil may receive inlet air temperatures less than the inlet temperature to the primary coil (immediately adjacent to the IT racks). (e.g., approximately 6.2° C. (approximately 6.2° C. less than the inlet temperature to the primary coil) The liquid and partial vapor leaving the micro channel then enters a simple serpentine single row evaporator coil. This serpentine coil is closest to the IT rack. Therefore the serpentine coil receives the hottest air (e.g., approximately 46.6° C.). The remaining liquid can be boiled off in serpentine coil thereby utilizing the full heat rejection benefits of latent heat of vaporization principles. There are no thermal expansion valves or other pressure metering devices ahead of the coils. Such a dual coil circuit is described in commonly-owned international application no. PCT/US2011/043893, which was filed on Jul. 13, 2011, the entire contents of which are hereby incorporated herein by reference.

Figure 18:
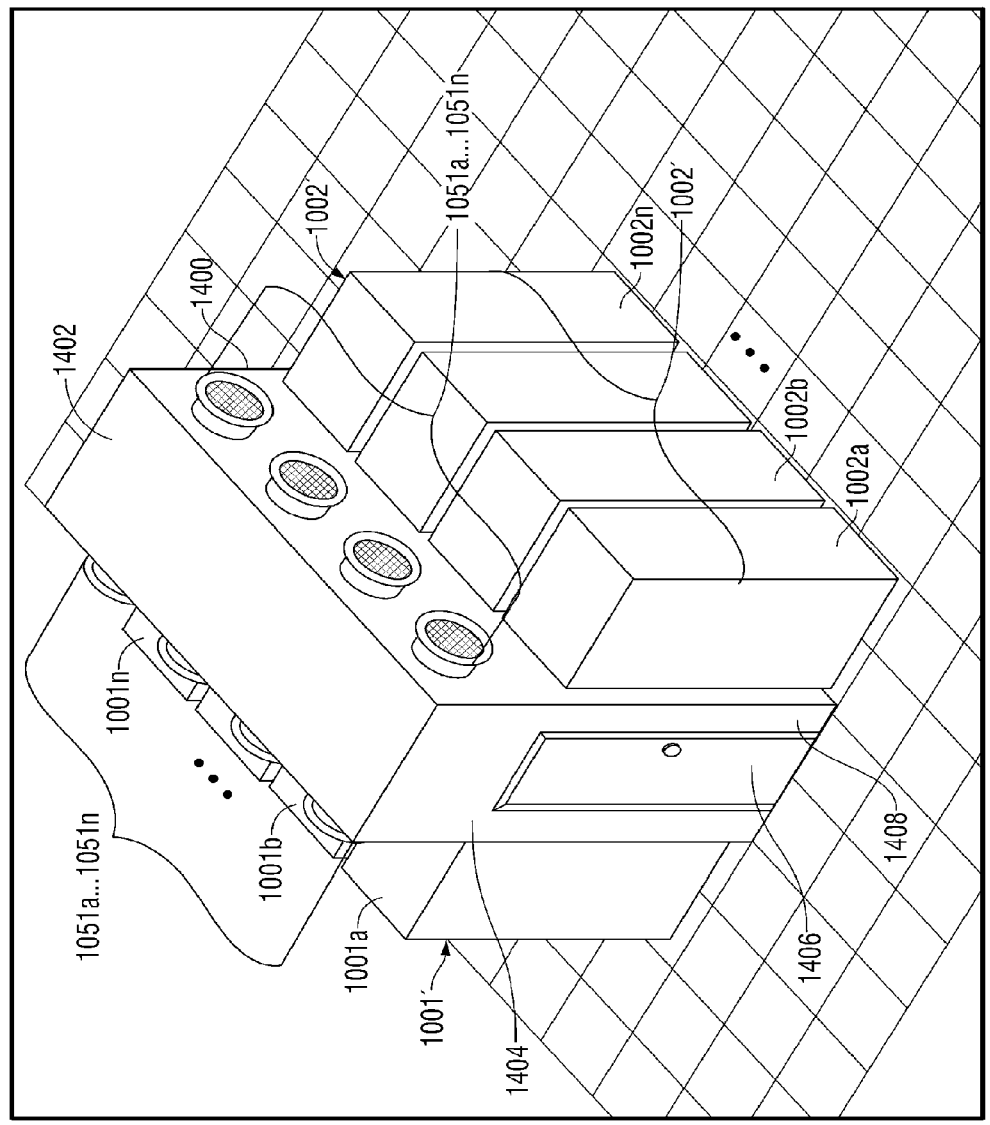
FIG. 18 is a perspective view of a data center assembly illustrating a building enclosure over the hot aisle of the data center assembly according to embodiments the present disclosure.

FIG. 18 is a perspective view of one embodiment of a data center assembly according to the present disclosure illustrating a hot aisle enclosure 1400. The hot aisle enclosure 1400 includes a roof 1402 and a shroud 1404 that form a conduit through which air can flow. The hot aisle enclosure 1400 also includes a plurality of forced-flow cooling devices 1051*a*, . . . , 1051*n* and 1052*a*, . . . , 1052*n* to pull air up through the hot aisle and exhaust it to the atmosphere outside of the hot aisle enclosure 1400. The hot aisle enclosure 1400 also includes an access door 1406 in an end wall 1408 through which a person can access the hot aisle and perform maintenance or upgrades on components of the data center assembly.

While several embodiments of the disclosure have been shown in the drawings, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

What is claimed is:

1. A modular server rack cooling structure for cooling at least one server in at least one rack of a data center, the modular server rack cooling structure comprising:
   a first supporting member including a first plurality of beam members, wherein the first plurality of beam members are directly coupled to each other to form a substantially U-shaped configuration;
   a second supporting member including a second plurality of beam members, wherein the second plurality of beam members are directly coupled to each other to form a substantially U-shaped configuration, wherein the first and second supporting members are disposed in a diametrically opposed orientation;
   a third supporting member including a third plurality of beam members, wherein the third plurality of beam members are directly coupled to an upper end of each of the first and second plurality of beam members;
   a first heat exchanger directly coupled to the first plurality of beam members of the first supporting member such that the first heat exchanger is positioned in heat transfer relationship with a first plurality of servers, wherein the first heat exchanger is not attached to the at least one rack;
   a second heat exchanger coupled to the second plurality of beam members of the second supporting member such that the second heat exchanger is positioned in heat transfer relationship with a second plurality of servers, wherein the second heat exchanger is not attached to the at least one rack;
   a third heat exchanger coupled to the third plurality of beam members of the third supporting member, the third heat exchanger positioned at a right angle with respect to the first heat exchanger and the second heat exchanger; and
   a fourth heat exchanger coupled to the third plurality of beam members of the third supporting member and extending upward from the third plurality of beam members at an acute angle with respect to the third plurality of beam members.

2. The modular server rack cooling structure according to claim 1, wherein the first heat exchanger has a dimension defining an edge that is rotatably coupled to a beam member of the first plurality of beam members.

3. The modular server rack cooling structure according to claim 2, wherein at least one of the first and second plurality of beam members is a horizontal beam member or a vertical beam member.

4. The modular server rack cooling structure according to claim 1, wherein the first plurality of beam members comprises at least first, second and third beam members, the first beam member substantially orthogonally coupled to the second beam member and the third beam member substantially orthogonally coupled to the second beam member to form a substantially U-shaped configuration, and wherein the first heat exchanger has a dimension defining an edge that is rotatably coupled to the first beam member, the second beam member, or the third beam member.

5. The modular server rack cooling structure according to claim 4, wherein the dimension defining the edge of the first heat exchanger has a substantially longitudinal dimension defining a longitudinal edge of the first heat exchanger and wherein the longitudinal edge of the first heat exchanger is rotatably coupled to the first beam member or the third beam member.

6. The modular server rack cooling structure according to claim 5, wherein the second plurality of beam members comprises at least first, second, and third beam members, the first beam member substantially orthogonally coupled to the second beam member and the third beam member substantially orthogonally coupled to the second beam member to form a substantially U-shaped configuration.

7. The modular server rack cooling structure according to claim 6, wherein the second heat exchanger is disposed vertically, horizontally or diagonally.

8. The modular server rack cooling structure according to claim 1, wherein the at least one rack is at least a first rack and the data center further includes at least a second rack for supporting at least one server, wherein the at least a first rack and the at least a second rack are disposed opposite one another to form a hot aisle or a cold aisle between the at least a first rack and the at least a second rack, wherein the at least a second rack is disposed adjacent the second plurality of beam members of the second supporting member.

9. The modular server rack cooling structure according to claim 1, further comprising at least one forced fluid-flow device configured and disposed with respect to the first heat exchanger to provide a flow of fluid between the at least one server and the first heat exchanger.

10. The modular server rack cooling structure according to claim 6, wherein the third plurality of beam members comprises at least first and second beam members extending from the first supporting member to the second supporting member, wherein the third heat exchanger has a dimension defining an edge that is rotatably coupled to the first beam member or the second beam member of the third plurality of beam members.

11. A modular data center system, comprising:
- at least a first rack and at least a second rack disposed opposite one another to form a hot aisle or a cold aisle between the at least a first rack and the at least a second rack, each rack supporting at least one server;
- a modular server rack cooling structure comprising:
  - a first supporting member including a first plurality of beam members, wherein the first plurality of beam members are directly coupled to each other to form a substantially U-shaped configuration, wherein the first supporting member is disposed adjacent the at least a first rack;
  - a second supporting member including a second plurality of beam members, wherein the second plurality of beam members are directly coupled to each other to form a substantially U-shaped configuration, wherein the second supporting member is disposed adjacent the at least a second rack such that the first and second supporting members are disposed in a diametrically opposed orientation;
  - a third supporting member including a third plurality of beam members, wherein the third plurality of beam members are directly coupled to an upper end of each of the first and second plurality of beam members;
  - a first heat exchanger coupled to the first plurality of beam members of the first supporting member such that the first heat exchanger is positioned in heat transfer relationship with at least one server of the at least a first rack, wherein the first heat exchanger is not attached to the at least a first rack;
  - a second heat exchanger coupled to the second plurality of beam members of the second supporting member such that the second heat exchanger is in heat transfer relationship with at least one server of the at least a second rack, wherein the second heat exchanger is not attached to the at least a second rack;
  - a third heat exchanger coupled to the third plurality of beam members of the third supporting member, the third heat exchanger positioned at a right angle with respect to the first heat exchanger and the second heat exchanger; and
  - a fourth heat exchanger coupled to the third plurality of beam members of the third supporting member and extending upward from the third plurality of beam members at an acute angle with respect to the third plurality of beam members.

12. The modular data center system according to claim 11, wherein the first heat exchanger has a dimension defining an edge that is rotatably coupled to a beam member of the first plurality of beam members, and the second heat exchanger has a dimension defining an edge that is rotatably coupled to a beam member of the second plurality of beam members.

13. The modular data center system according to claim 12, further comprising at least one forced fluid-flow device configured to provide a flow of fluid between the servers and the heat exchangers.

14. The modular data center system according to claim 12, wherein at least one of the plurality of beam members are vertical beam members disposed adjacent to the at least a first rack and the at least a second rack.

15. The modular data center system according to claim 12 wherein the fourth heat exchanger is in heat transfer relationship with the at least one server of the at least a first rack or the at least one server of the at least a second rack.

16. The modular data center system according to claim 15, wherein the fourth heat exchanger has a dimension defining an edge that is rotatably coupled to a beam member of the third plurality of beam members.

17. The modular data center system according to claim 15, wherein the second heat exchanger is disposed vertically, horizontally or diagonally.

18. A method of installing a modular server rack cooling structure for cooling at least a first server installed in at least a first rack and at least a second server installed in at least a second rack, the at least a first rack and the at least a second rack disposed opposite from each other to form at least a portion of a hot aisle or a cold aisle, the method comprising:
- positioning at least a portion of a modular support structure in the hot aisle or the cold aisle, the modular support structure comprising at least a first supporting member including a first plurality of beam members directly coupled to each other to form a substantially U-shaped configuration, a second supporting member including a second plurality of beams members directly coupled to each other to form a substantially U-shaped configuration, and a third supporting member including a third plurality of beam members directly coupled to an upper end of each of the first and second plurality of beam members;
- coupling a first heat exchanger to the first plurality of beam members of the first supporting member so that the first heat exchanger is positioned adjacent to the at least a first server of the at least a first rack;
- coupling a second heat exchanger to the second plurality of beam members of the second supporting member so that the second heat exchanger is positioned adjacent to the at least a second server of the at least a second rack;
- coupling a third heat exchanger to the third plurality of beam members of the third supporting member so that the third heat exchanger is positioned at a right angle with respect to the first heat exchanger and the second heat exchanger; and
- coupling a fourth heat exchanger to the third plurality of beam members of the third supporting member and extending upward from the third plurality of beam members at an acute angle with respect to the third plurality of beam members.

* * * * *